(12) United States Patent
Oh et al.

(10) Patent No.: US 11,637,075 B2
(45) Date of Patent: Apr. 25, 2023

(54) SEMICONDUCTOR DEVICE HAVING THREE-DIMENSIONAL STRUCTURE

(71) Applicant: SK hynix Inc., Icheon-si (KR)

(72) Inventors: Sung Lae Oh, Icheon-si (KR); Sang Woo Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 153 days.

(21) Appl. No.: 17/163,891

(22) Filed: Feb. 1, 2021

(65) Prior Publication Data

US 2022/0068844 A1 Mar. 3, 2022

(30) Foreign Application Priority Data

Sep. 2, 2020 (KR) .................. 10-2020-0111624

(51) Int. Cl.
 *H01L 23/00* (2006.01)
(52) U.S. Cl.
 CPC ............ *H01L 23/562* (2013.01); *H01L 24/08* (2013.01); *H01L 2224/08147* (2013.01)
(58) Field of Classification Search
 CPC .............................. H01L 23/562; H01L 24/08
 See application file for complete search history.

(56) References Cited

U.S. PATENT DOCUMENTS

| | | | | |
|---|---|---|---|---|
| 10,083,917 | B1 * | 9/2018 | Joshi | .................... H01L 23/04 |
| 10,438,863 | B1 * | 10/2019 | Boja | ..................... H01L 21/52 |
| 10,658,381 | B1 | 5/2020 | Yu et al. | |
| 10,879,206 | B1 * | 12/2020 | Wu | ........................ H01L 24/13 |
| 11,164,749 | B1 * | 11/2021 | Chong | .............. H01L 21/67075 |
| 11,222,867 | B1 * | 1/2022 | Huang | .................... H01L 24/73 |
| 2010/0101847 | A1 * | 4/2010 | Kim | ........................ H05K 1/186 |
| | | | | 29/832 |
| 2012/0201110 | A1 * | 8/2012 | Inoue | ................. G11B 7/24038 |
| 2012/0248580 | A1 * | 10/2012 | Matsugai | ................ H01L 25/50 |
| | | | | 257/621 |
| 2014/0175474 | A1 * | 6/2014 | Han | ...................... H01L 33/007 |
| | | | | 438/47 |
| 2016/0190103 | A1 * | 6/2016 | Kabe | ..................... H01L 23/564 |
| | | | | 257/777 |
| 2016/0233123 | A1 * | 8/2016 | Kato | ................. H01L 21/30604 |
| 2016/0276313 | A1 * | 9/2016 | Kume | .................... H01L 23/481 |
| 2016/0374198 | A1 * | 12/2016 | Kim | ....................... H05K 1/0271 |
| 2017/0005044 | A1 * | 1/2017 | Ishido | ................. H01L 21/4853 |
| 2017/0104137 | A1 * | 4/2017 | Kobayakawa | ...... H01L 33/0095 |
| 2017/0278830 | A1 * | 9/2017 | Kim | ........................ H01L 25/50 |
| 2017/0320247 | A1 * | 11/2017 | Aizawa | ............... H01L 21/4828 |

(Continued)

FOREIGN PATENT DOCUMENTS

| | | | |
|---|---|---|---|
| KR | 1020120048841 A | | 5/2012 |
| KR | 1020130123722 A | | 11/2013 |
| KR | 1020200037894 A | | 10/2020 |

*Primary Examiner* — Nathan W Ha

(57) ABSTRACT

A semiconductor device having a three-dimensional structure includes a first wafer including a first bonding pad on one surface thereof; a second wafer including a second bonding pad, which is bonded to the first bonding pad, on one surface thereof bonded to the one surface of the first wafer; a plurality of anti-warpage grooves on the one surface of the first wafer, and laid out in a stripe shape; and a plurality of anti-warpage ribs on the one surface of the second wafer and coupled respectively to the plurality of anti-warpage grooves, and laid out in a stripe shape.

20 Claims, 24 Drawing Sheets

(56) References Cited

U.S. PATENT DOCUMENTS

| | | | |
|---|---|---|---|
| 2017/0373211 A1* | 12/2017 | Murali | C25D 1/08 |
| 2018/0007799 A1* | 1/2018 | Jeong | H05K 3/103 |
| 2018/0103547 A1* | 4/2018 | Chen | H01L 23/49838 |
| 2018/0130769 A1* | 5/2018 | Tan | H01L 21/481 |
| 2018/0138223 A1* | 5/2018 | Kotoo | H01L 23/522 |
| 2018/0151472 A1* | 5/2018 | Chen | H01L 23/3731 |
| 2018/0166729 A1* | 6/2018 | Yajima | H01M 8/2432 |
| 2018/0204807 A1* | 7/2018 | Aizawa | H01L 23/5383 |
| 2018/0261573 A1* | 9/2018 | Chen | H01L 21/6835 |
| 2018/0342466 A1* | 11/2018 | Lin | H01L 21/563 |
| 2019/0109122 A1* | 4/2019 | Ong | H01L 23/16 |
| 2019/0148310 A1* | 5/2019 | Leong | H01L 24/16 257/668 |
| 2019/0164914 A1* | 5/2019 | Hu | H01L 24/06 |
| 2019/0221465 A1* | 7/2019 | Kilger | H01L 21/568 |
| 2019/0259983 A1* | 8/2019 | Yl | H01M 50/20 |
| 2019/0267310 A1* | 8/2019 | Rodriguez | H01L 24/32 |
| 2019/0269046 A1* | 8/2019 | Takizawa | H01L 23/3121 |
| 2019/0333871 A1* | 10/2019 | Chen | H01L 23/5384 |
| 2019/0363079 A1* | 11/2019 | Thei | H01L 24/03 |
| 2020/0027837 A1* | 1/2020 | Jeng | H01L 23/3135 |
| 2020/0058570 A1* | 2/2020 | Aoya | H01L 21/561 |
| 2020/0066624 A1* | 2/2020 | Chou | H01L 21/481 |
| 2020/0101672 A1* | 4/2020 | Watanabe | B29C 64/241 |
| 2020/0127032 A1* | 4/2020 | Ogino | H01L 24/80 |
| 2020/0135602 A1* | 4/2020 | Zhang | H01L 23/538 |
| 2020/0135789 A1* | 4/2020 | Cheng | H01L 27/1463 |
| 2020/0168523 A1* | 5/2020 | Huang | H01L 21/4882 |
| 2020/0194252 A1* | 6/2020 | Chou | H01L 33/007 |
| 2020/0251423 A1* | 8/2020 | Yabuta | H01L 25/07 |
| 2020/0251443 A1* | 8/2020 | Kanakamedala | H01L 24/94 |
| 2020/0258750 A1* | 8/2020 | Carney | H01L 23/3114 |
| 2020/0286735 A1* | 9/2020 | Carney | H01L 23/3178 |
| 2020/0321259 A1* | 10/2020 | Su | H01L 23/3128 |
| 2020/0335473 A1* | 10/2020 | Zhou | H01L 24/80 |
| 2020/0365408 A1* | 11/2020 | Seddon | H01L 21/568 |
| 2020/0388600 A1* | 12/2020 | Huang | H05K 1/185 |
| 2021/0005567 A1* | 1/2021 | Huang | H01L 23/147 |
| 2021/0035807 A1* | 2/2021 | Lin | H01L 23/3114 |
| 2021/0035922 A1* | 2/2021 | Tokuya | H01L 23/66 |
| 2021/0050308 A1* | 2/2021 | Kim | H01L 24/13 |
| 2021/0051800 A1* | 2/2021 | Wang | H05K 3/32 |
| 2021/0066208 A1* | 3/2021 | Lu | H01L 25/0652 |
| 2021/0074648 A1* | 3/2021 | Iyer | H01L 23/5387 |
| 2021/0082837 A1* | 3/2021 | Huang | H01L 23/3135 |
| 2021/0104472 A1* | 4/2021 | Shimamoto | H01L 27/1157 |
| 2021/0104489 A1* | 4/2021 | Park | H01L 21/563 |
| 2021/0119156 A1* | 4/2021 | Li | H01L 51/003 |
| 2021/0134641 A1* | 5/2021 | Fiorenza | H01L 21/6835 |
| 2021/0166985 A1* | 6/2021 | Fuji | H01L 23/49541 |
| 2021/0193550 A1* | 6/2021 | Hung | H01L 21/4882 |
| 2021/0193590 A1* | 6/2021 | Wang | H01L 24/32 |
| 2021/0202458 A1* | 7/2021 | Jung | H01L 25/0657 |
| 2021/0217730 A1* | 7/2021 | Parekh | H01L 24/05 |
| 2021/0268702 A1* | 9/2021 | Okahara | B29C 45/73 |
| 2021/0280496 A1* | 9/2021 | Ying | H01L 23/367 |
| 2021/0280523 A1* | 9/2021 | We | H01L 21/4853 |
| 2021/0280534 A1* | 9/2021 | Hokazono | H01L 25/50 |
| 2021/0288038 A1* | 9/2021 | Oga | H01L 21/76224 |
| 2021/0296299 A1* | 9/2021 | Shibata | H01L 27/11556 |
| 2021/0320075 A1* | 10/2021 | Hou | H01L 25/50 |
| 2021/0351044 A1* | 11/2021 | Chiang | H01L 23/562 |
| 2021/0358865 A1* | 11/2021 | Tokranov | H01L 23/4824 |
| 2022/0013401 A1* | 1/2022 | Wirz | H01L 21/6836 |
| 2022/0028801 A1* | 1/2022 | Tien | H01L 23/5384 |
| 2022/0028804 A1* | 1/2022 | Mitsuhashi | H01L 23/585 |
| 2022/0059574 A1* | 2/2022 | Chang | H01L 27/1214 |
| 2022/0131338 A1* | 4/2022 | Satou | H01S 5/02253 |
| 2022/0254695 A1* | 8/2022 | Guo | H01L 23/3135 |

* cited by examiner

SEMICONDUCTOR DEVICE HAVING THREE-DIMENSIONAL STRUCTURE

CROSS-REFERENCE TO RELATED APPLICATION

The present application claims priority under 35 U.S.C. § 119(a) to Korean Patent Application No. 10-2020-0111624 filed in the Korean Intellectual Property Office on Sep. 2, 2020, which is incorporated herein by reference in its entirety.

BACKGROUND

1. Technical Field

Various embodiments generally relate to a semiconductor technology, and particularly, to a semiconductor device having a three-dimensional structure that uses a wafer bonding technique.

2. Related Art

In a semiconductor device, to improve high capacity and miniaturization, it is required to increase the degree of integration. Proposals for increasing the degree of integration include a structure in which components included in the semiconductor device are fabricated not on a single wafer, but divisionally fabricated on at least two wafers, and then the wafers are bonded to electrically couple the components.

Material layers used in a semiconductor manufacturing process have intrinsic stresses, and warpage may occur in a wafer due to stresses induced by a material layer deposition process and a heat treatment process. When warpage occurs in the wafer, a bonding failure may occur in which the adhesion force between wafers decreases and electrical coupling between the wafers is cut off.

SUMMARY

Various embodiments are directed to suggesting measures capable of suppressing or reducing the warpage of a wafer.

In an embodiment, a semiconductor device having a three-dimensional structure may include: a first wafer including a first bonding pad on one surface thereof; a second wafer including a second bonding pad, which is bonded to the first bonding pad, on one surface thereof bonded to the one surface of the first wafer; a plurality of anti-warpage grooves on the one surface of the first wafer, and laid out in a stripe shape; and a plurality of anti-warpage ribs on the one surface of the second wafer and coupled respectively to the plurality of anti-warpage grooves, and laid out in a stripe shape.

In an embodiment, a semiconductor device having a three-dimensional structure may include: a first wafer including a first bonding pad on one surface thereof; a second wafer including a second bonding pad, which is bonded to the first bonding pad, on one surface thereof bonded to the one surface of the first wafer; a plurality of first anti-warpage pads on the one surface of the first wafer, and laid out in a stripe shape; and a plurality of second anti-warpage pads on the one surface of the second wafer and bonded respectively to the plurality of first anti-warpage pads, and laid out in a stripe shape.

In an embodiment, a semiconductor device having a three-dimensional structure may include: a first wafer including a first bonding pad on one surface thereof; a second wafer including a second bonding pad, which is bonded to the first bonding pad, on one surface thereof bonded to the one surface of the first wafer; and a plurality of anti-warpage metal ribs defined in the first wafer, and laid out in a stripe shape.

DETAILED DESCRIPTION

Figure 1:
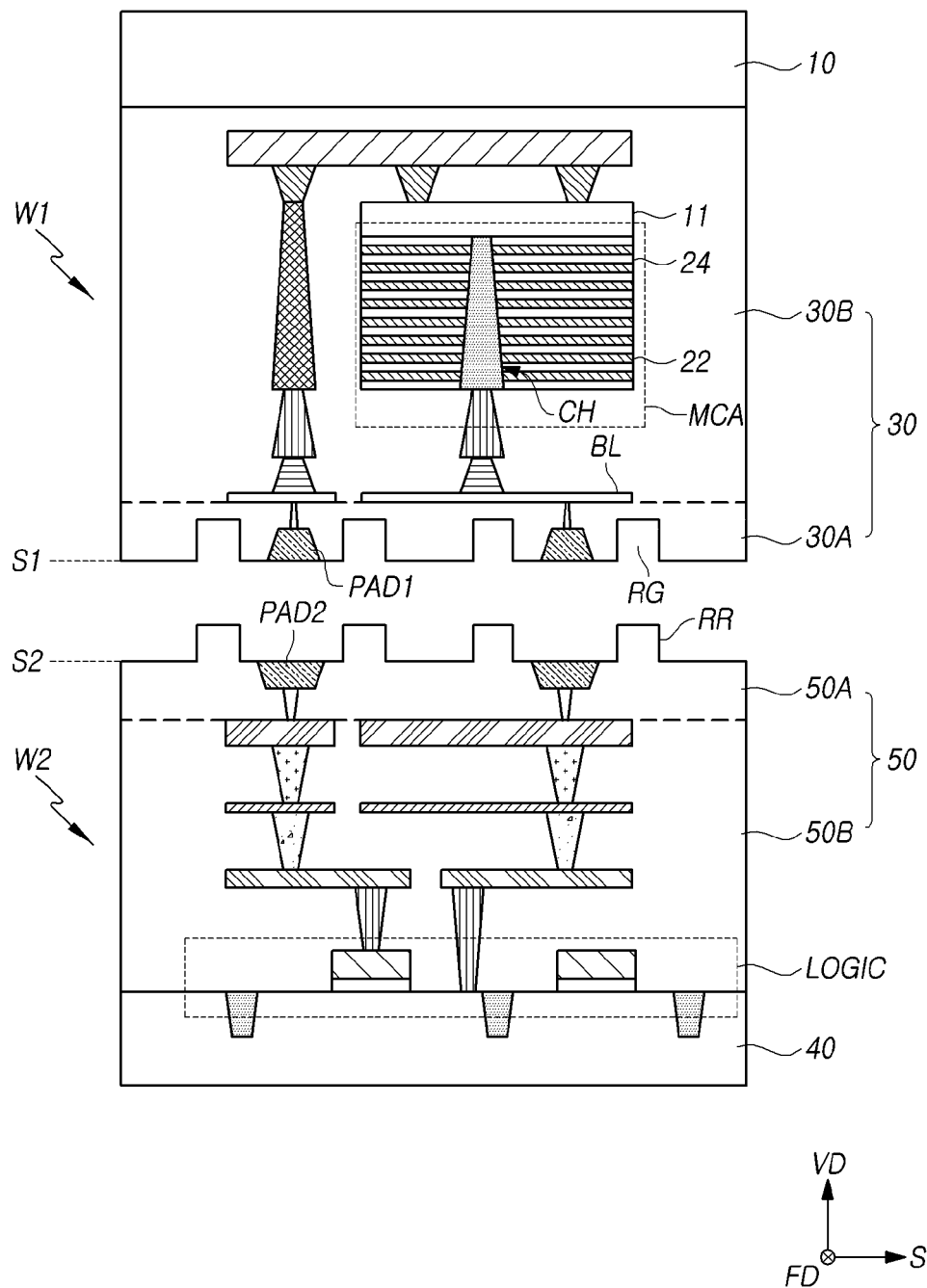
FIG. 1 is a cross-sectional view illustrating a semiconductor device having a three-dimensional structure in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

Because the figures, dimensions, ratios, angles, numbers of elements given in the drawings that describe embodiments of the disclosure are merely illustrative, the present disclosure is not limited to the illustrated matters. Throughout the specification, like reference numerals refer to like components. In describing the disclosure, when it is determined that a detailed description of the related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article (e.g., "a," "an" or "the") is used when referring to a singular noun, the article may include a plural of that noun unless specifically stated otherwise.

In interpreting elements in embodiments of the disclosure, they should be interpreted as including error margins even in the absence of explicit statements.

Also, in describing the components of the disclosure, there may be used terms such as first, second, A, B, (a), and (b). These are solely for the purpose of differentiating one component from another component and do not limit the substances, order, sequence or number of the components. Also, components in embodiments of the disclosure are not limited by these terms. These terms are used to merely distinguish one component from another component. Accordingly, as used herein, a first component may be a second component within the technical spirit of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," one or more other elements may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

Hereinafter, various examples of embodiments of the disclosure will be described in detail with reference to the accompanying drawings.

FIG. 1 is a cross-sectional view illustrating a semiconductor device having a three-dimensional structure in accordance with an embodiment of the disclosure.

Referring to FIG. 1, a semiconductor device having a three-dimensional structure in accordance with an embodiment of the disclosure may include a first wafer W1 and a second wafer W2, which are bonded to each other. In order to facilitate understanding an embodiment of the disclosure, cross-sectional views used for reference in the present specification illustrate that the first wafer W1 and the second wafer W2 are separated. However, it should be understood that the first wafer W1 and the second wafer W2 are actually bonded to each other.

The first wafer W1 may include a first substrate 10, a memory cell array MCA, which is defined below the first substrate 10, and a dielectric layer 30, which is defined under the first substrate 10 to cover the memory cell array MCA. The memory cell array MCA may have a structure in which a plurality of memory cells is three-dimensionally stacked. For example, the memory cell array MCA may include a plurality of electrode layers 22 and a plurality of interlayer dielectric layers 24, which are alternately stacked under a source plate 11, and a vertical channel CH, which passes through the plurality of electrode layers 22 and the plurality of interlayer dielectric layers 24.

The electrode layers 22 may include at least one source select line, at least one drain select line, and a plurality of word lines. The vertical channel CH may be coupled to a bit line BL. At least one source select transistor, a plurality of memory cells and at least one drain select transistor may be disposed along one vertical channel CH in a vertical direction VD, thereby configuring one cell string. The vertical direction VD represents a direction protruding vertically from the top surface of the first substrate 10. Each memory cell may be accessed through the bit line BL and a word line. Although the present embodiment discloses a three-dimensionally stacked memory as an example, it is to be noted that the scope of the disclosure is not limited thereto.

The second wafer W2 may include a second substrate 40, a logic circuit LOGIC, which is defined on the second substrate 40, and a dielectric layer 50, which is defined on the second substrate 40 to cover the logic circuit LOGIC. The logic circuit LOGIC may serve to control the memory cell array MCA.

The first wafer W1 may include, on one surface S1 thereof, a plurality of first bonding pads PAD1, which are electrically coupled to the memory cell array MCA. The second wafer W2 may include, on one surface S2 thereof, a plurality of second bonding pads PAD2 which are electrically coupled to the logic circuit LOGIC. As the first bonding pads PAD1 and the second bonding pads PAD2 are bonded to each other, the memory cell array MCA of the first wafer W1 and the logic circuit LOGIC of the second wafer W2 may be electrically coupled.

As the dielectric layer 30 is etched from the one surface S1 to a predetermined depth, a plurality of anti-warpage grooves RG may be formed. The plurality of anti-warpage grooves RG may serve to disperse or mitigate a stress, thereby suppressing the warpage of the first wafer W1.

A surface part 30A of the dielectric layer 30 in which the plurality of anti-warpage grooves RG are formed may be made of a dielectric material that has superior hardness to an inner part 30B of the dielectric layer 30. Although not illustrated, the dielectric layer 30 may include an etch stop layer that serves as an etch stopper during an etching process for forming the anti-warpage grooves RG, and a depth of the anti-warpage grooves RG may be adjusted by changing a vertical position of the etch stop layer.

The dielectric layer 50 may include projections, from the one surface S2 of the second wafer W2, to a predetermined height in the vertical direction VD to form a plurality of anti-warpage ribs RR corresponding to the plurality of anti-warpage grooves RG of the first wafer W1. The plurality of anti-warpage ribs RR may serve to increase the rigidity of the second wafer W2, thereby suppressing the warpage of the second wafer W2.

A surface part 50A of the dielectric layer 50, from which the plurality of anti-warpage ribs RR are formed, may be made of a dielectric material that has superior hardness to an inner part 50B of the dielectric layer 50. Although not illustrated, the plurality of anti-warpage ribs RR may be formed by patterning the dielectric layer 50 through an etching process. Although not illustrated, the dielectric layer 50 may include an etch stop layer that serves as an etch stopper during an etching process for forming the anti-warpage ribs RR, and a height of the anti-warpage ribs RR may be adjusted by changing a vertical position of the etch stop layer.

Although FIG. 1 illustrates that the first wafer W1 is a cell wafer including the memory cell array MCA and the second wafer W2 is a logic wafer including the logic circuit LOGIC for controlling the memory cell array MCA, it is to be noted that the technical spirit of the disclosure is not limited thereto.

Hereinbelow, and in the accompanying drawings, two directions that are parallel to the top surface of the first substrate 10 and intersect with each other are defined as a first direction FD and a second direction SD, respectively.

For example, the first direction FD may correspond to the extending direction of word lines, and the second direction SD may correspond to the extending direction of bit lines. The first direction FD and the second direction SD may substantially perpendicularly intersect with each other. In the drawings, a direction indicated by an arrow and a direction opposite thereto represent the same direction.

Figure 2:
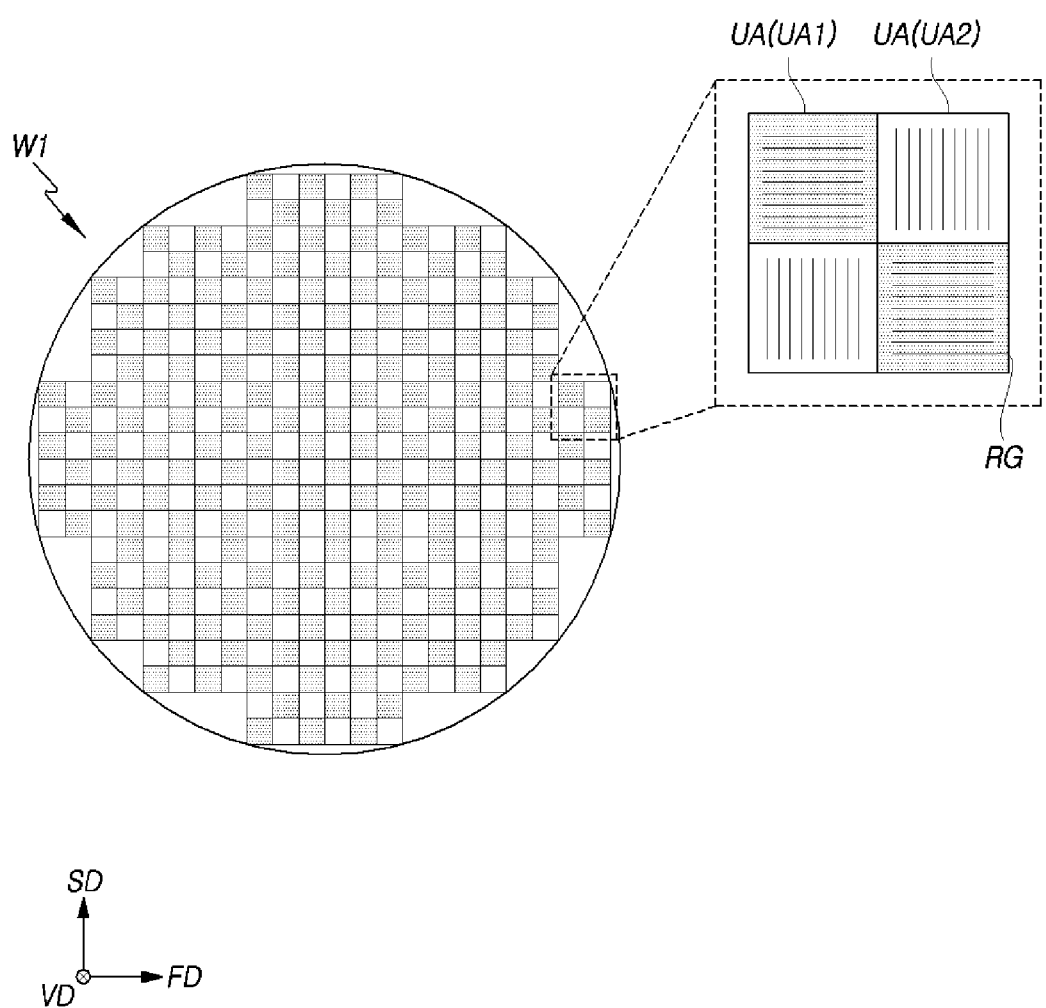
FIG. 2 is a top view illustrating a disposition of anti-warpage grooves.

FIG. 2 is a top view illustrating a disposition of anti-warpage grooves.

Referring to FIG. 2, the first wafer W1 may include a plurality of unit areas UA, which are arranged in the first direction FD and the second direction SD. The unit areas UA may include a plurality of first unit areas UA1 and a plurality of second unit areas UA2, which are alternately disposed in the first direction FD and the second direction SD, such as for example, in a checkerboard pattern.

A plurality of anti-warpage grooves RG having a linear or stripe shape may be laid out in each of the first unit areas UA1 and the second unit areas UA2.

An extending direction of the anti-warpage grooves RG in the first unit areas UA1 and an extending direction of the anti-warpage grooves RG in the second unit areas UA2 may be different from each other. For example, anti-warpage grooves RG extending in the first direction FD may be laid out in the first unit areas UA1, and anti-warpage grooves RG extending in the second direction SD may be laid out in the second unit areas UA2. Because anti-warpage grooves RG extend in different directions, intrinsic stresses induced in manufacturing processes in the first direction FD and in the second direction SD are avoided and prevented from being concentrated in any one direction.

In an embodiment, the number of first unit areas UA1 included in the first wafer W1 and the number of second unit areas UA2 included in the first wafer W1 may be the same, and the sum of areas of the first unit areas UA1 included in the first wafer W1 and the sum of areas of the second unit areas UA2 included in the first wafer W1 may be substantially the same.

The anti-warpage ribs RR (see FIG. 1) of the second wafer W2 (see FIG. 1) have substantially the same layout structure as the anti-warpage grooves RG. Therefore, hereinbelow, the layout structure of the anti-warpage ribs RR will not be separately described.

Figure 3A:
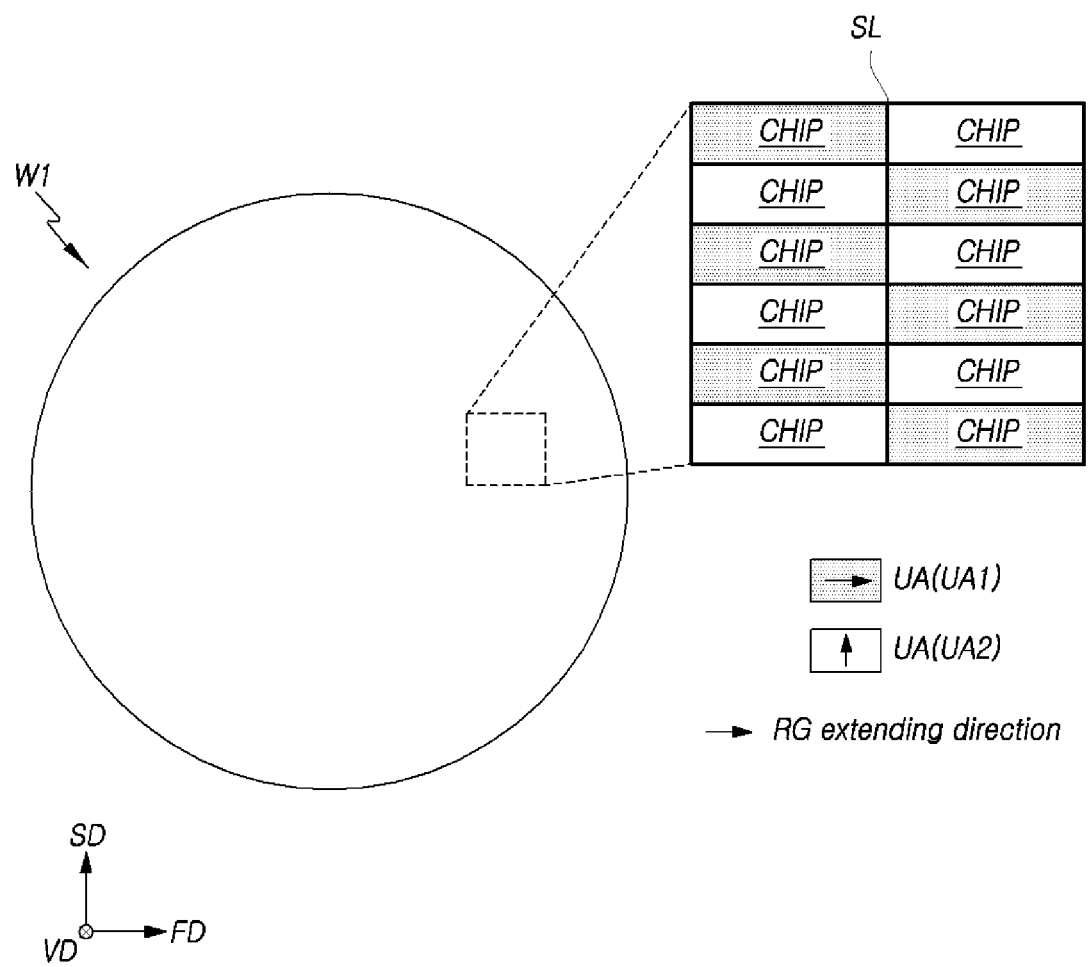
FIGS. 3A to 3C are top views illustrating methods of configuring unit areas.
Figure 3B:
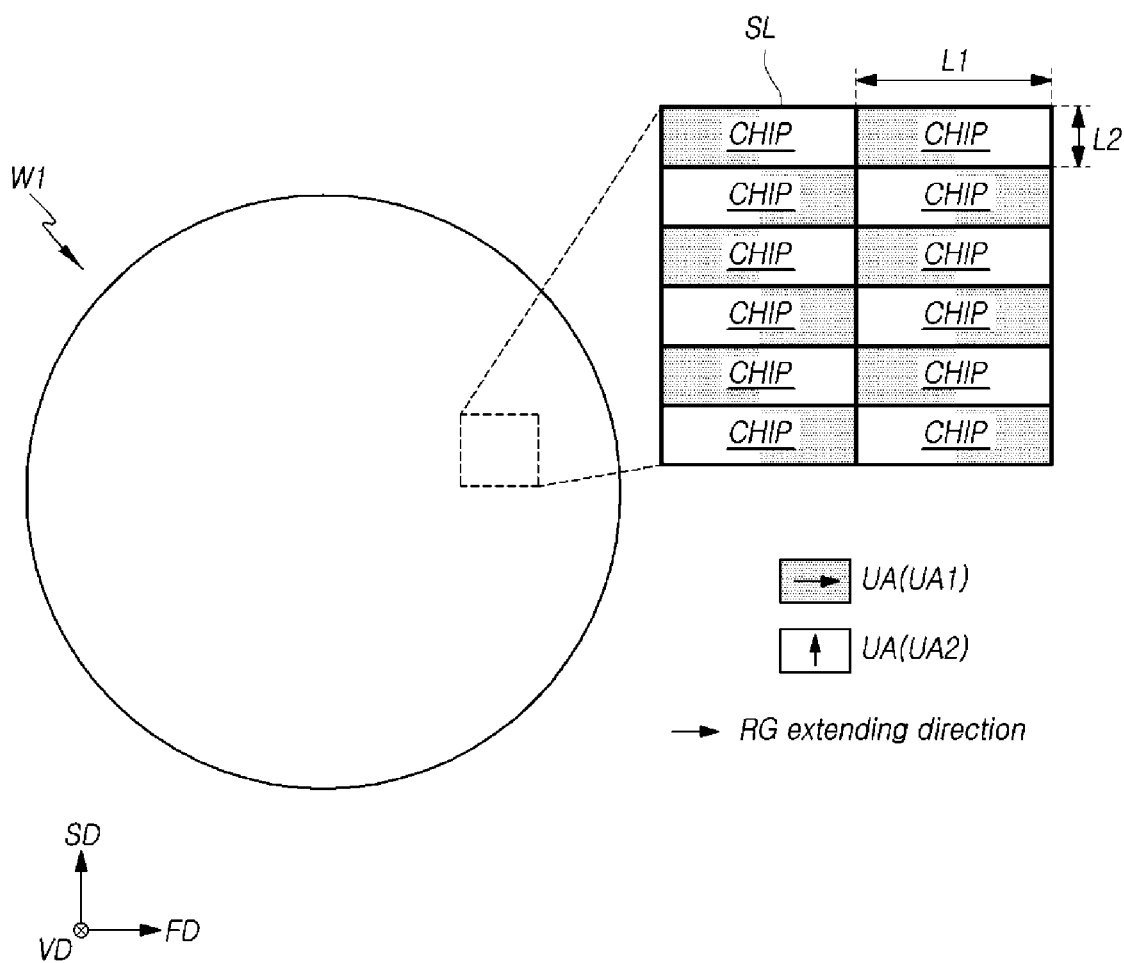
Figure 3C:
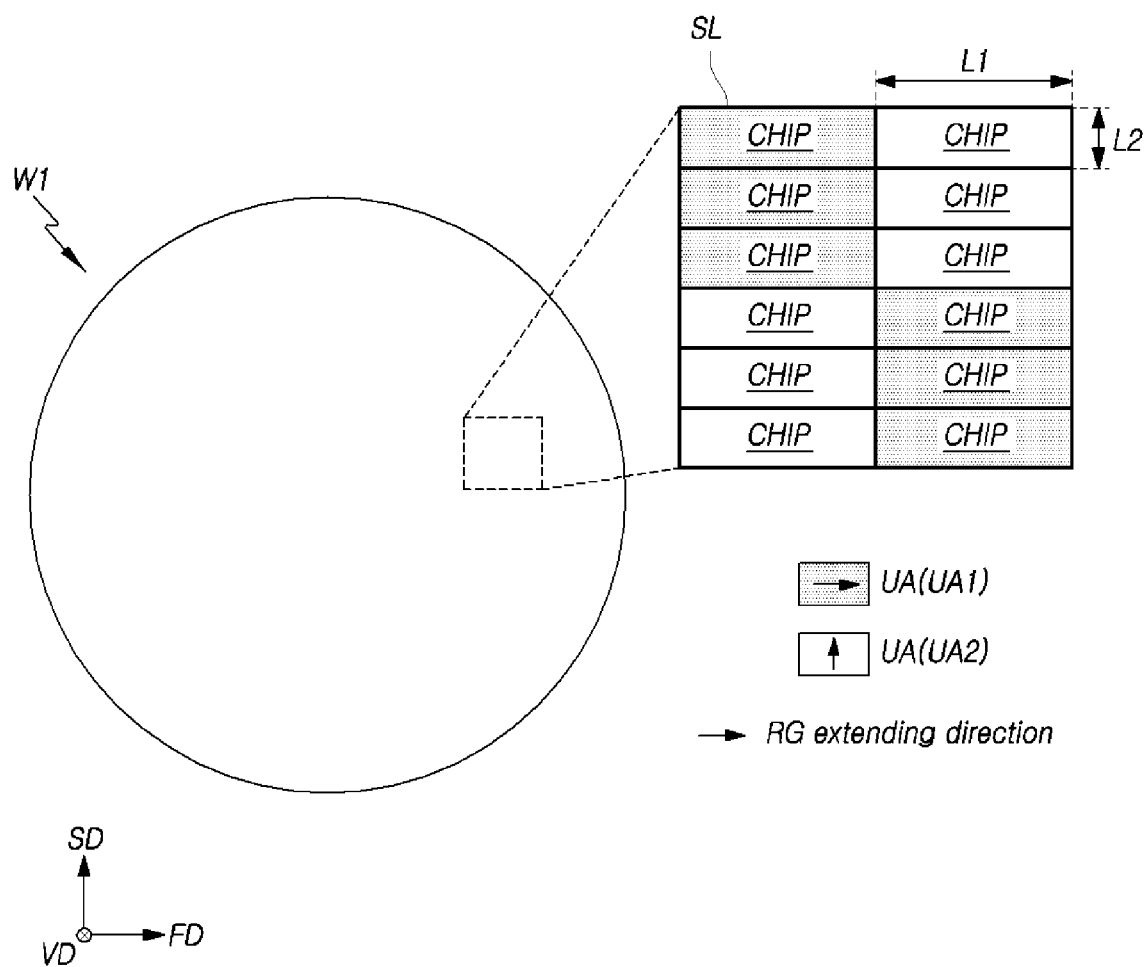

FIGS. 3A to 3C are top views illustrating methods of configuring unit areas.

Referring to FIG. 3A, a first wafer W1 may include a plurality of chip areas CHIP, which are disposed to be separated from one another, with scribe lanes SL, extending in the first direction FD and the second direction SD, interposed therebetween. The scribe lanes SL may serve as separation lines for separating the chip areas CHIP from one another during a singulation process. FIG. 3A illustrates a unit area UA that is configured in the unit of a chip area CHIP.

In a three-dimensional memory, asymmetry between lengths of the chip area CHIP in the first direction FD and the second direction SD may increase due to a design change that increases the stack number of memory cells. Such an increase in asymmetry may decrease a stress dispersion effect provided by the anti-warpage grooves RG, causing an unbalance between a stress in the first direction FD and a stress in the second direction SD. Therefore, it is necessary to reduce the difference between lengths of the unit area UA in the first direction FD and the second direction SD. Preferably, lengths of the unit area UA in the first direction FD and the second direction SD should be the same. That is to say, the unit area UA should have a square or substantially square structure.

As illustrated in FIG. 3B, in order to reduce the difference between lengths of the unit area UA in the first direction FD and the second direction SD, each chip area CHIP may be divided to form a plurality of unit areas UA. For example, in the case where a length L1 has a size approximately two times larger than a length L2, each chip area CHIP may be divided into two in the first direction FD to form two unit areas UA in each chip area CHIP.

As illustrated in FIG. 3C, a plurality of adjacent chip areas CHIP may be grouped to form one unit area UA. For example, in the case where a length L1 has a size approximately three times larger than a length L2, three chip areas CHIP that are continuously disposed in the second direction SD may be grouped to form one unit area UA.

Figure 4A:
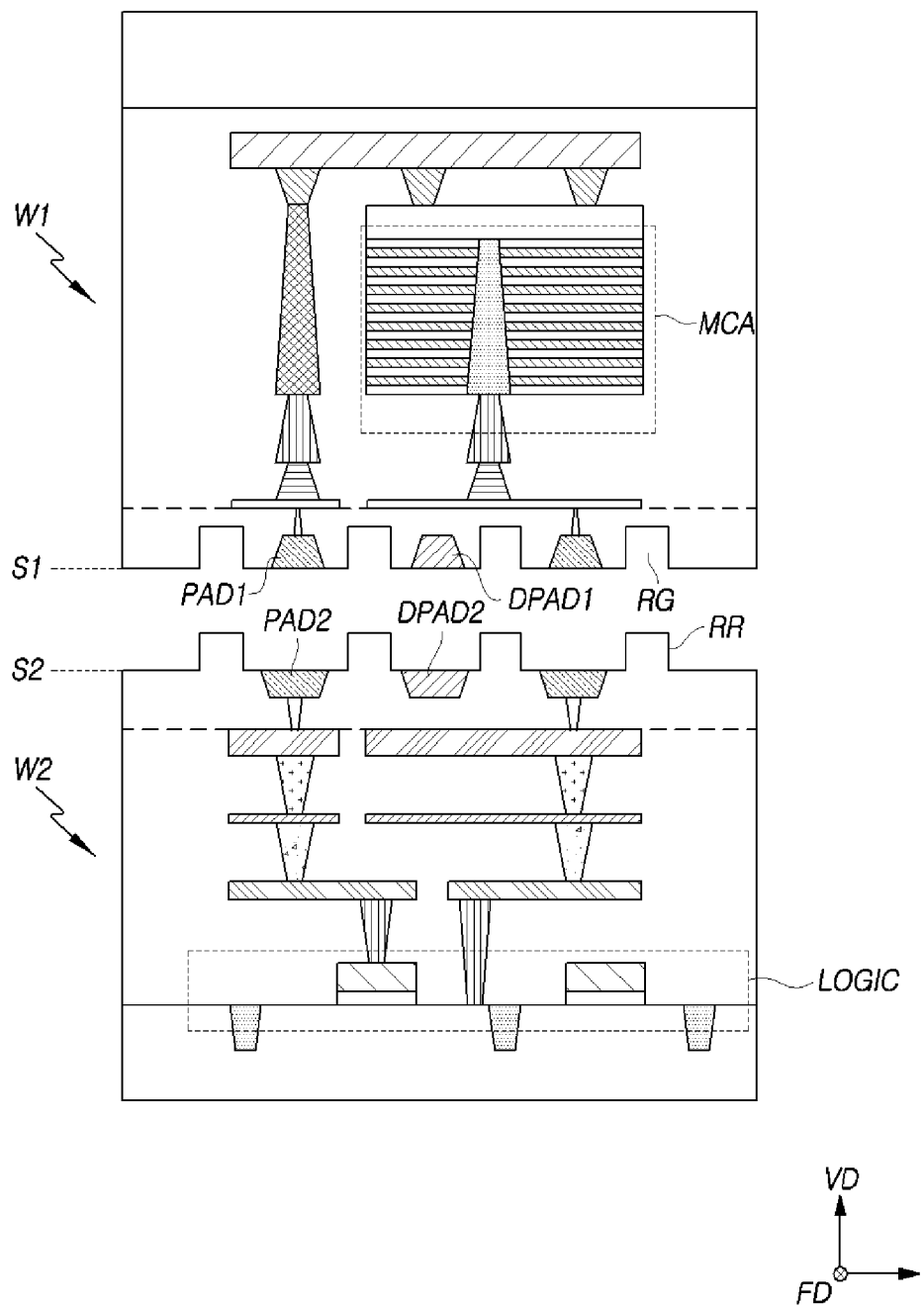
FIG. 4A is a cross-sectional view illustrating a semiconductor device having a three-dimensional structure in accordance with another embodiment of the disclosure.
Figure 4B:
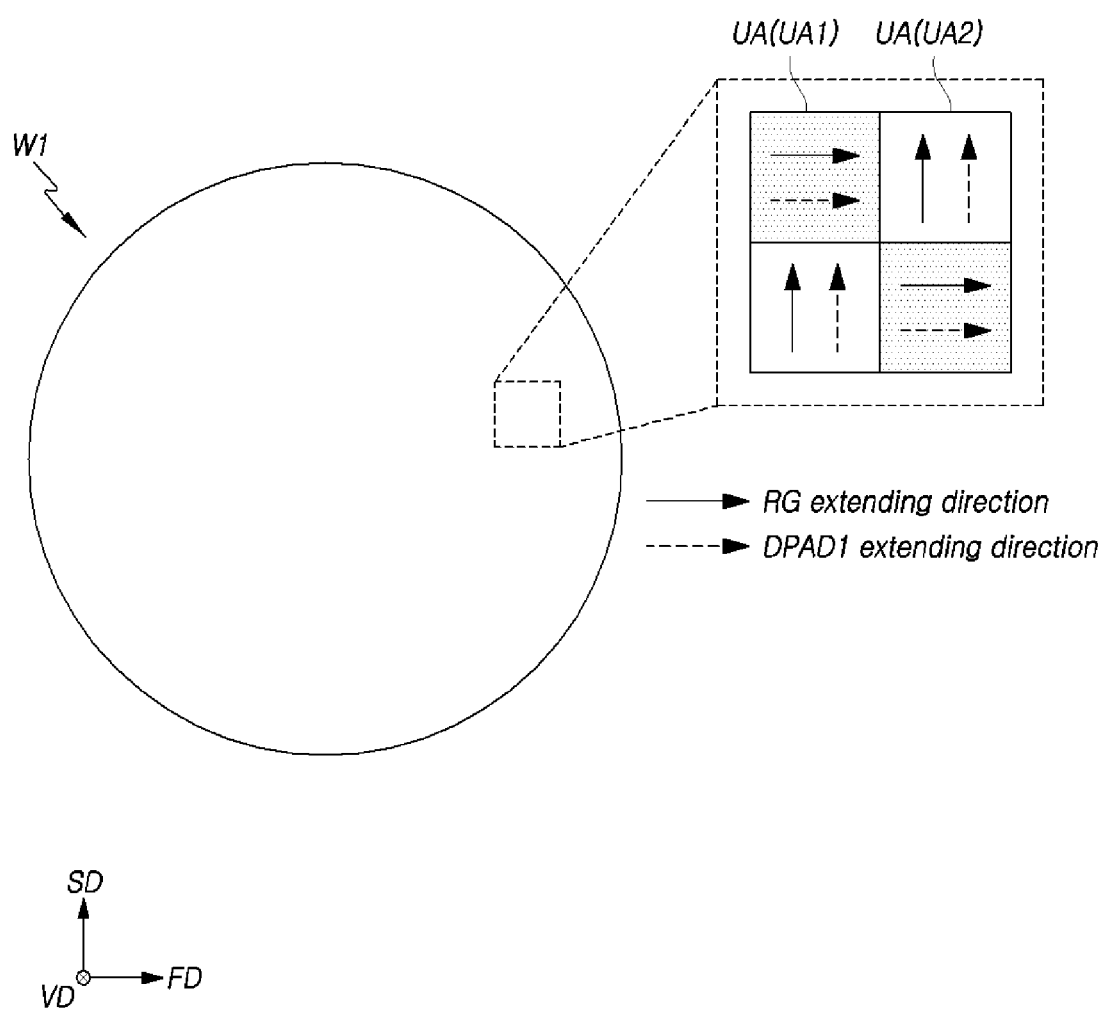
FIG. 4B is a top view illustrating extending directions of anti-warpage grooves and first anti-warpage pads of FIG. 4A.

FIG. 4A is a cross-sectional view illustrating a semiconductor device having a three-dimensional structure in accordance with another embodiment of the disclosure, and FIG. 4B is a top view illustrating extending directions of anti-warpage grooves and first anti-warpage pads of FIG. 4A.

Referring to FIG. 4A, a first anti-warpage pad DPAD1 may be defined on one surface S1 of a first wafer W1. The first anti-warpage pad DPAD1 may serve to suppress the warpage of the first wafer W1.

The first anti-warpage pad DPAD1 is a dummy pattern, which does not exert any influence on the operations of a memory cell array MCA and a logic circuit LOGIC. The first anti-warpage pad DPAD1 may be electrically isolated from the memory cell array MCA and the logic circuit LOGIC.

A second anti-warpage pad DPAD2, which is bonded to the first anti-warpage pad DPAD1, may be defined on one surface S2 of a second wafer W2. The second anti-warpage pad DPAD2 may serve to suppress the warpage of the second wafer W2.

The second anti-warpage pad DPAD2 is a dummy pattern, which does not exert any influence on the operations of the memory cell array MCA and the logic circuit LOGIC. The second anti-warpage pad DPAD2 may be electrically isolated from the memory cell array MCA and the logic circuit LOGIC.

The first and second anti-warpage pads DPAD1 and DPAD2 may be made of a conductive material that has a higher hardness than first and second bonding pads PAD1 and PAD2. For example, the first and second bonding pads PAD1 and PAD2 may be made of copper (Cu), and the first and second anti-warpage pads DPAD1 and DPAD2 may be made of tungsten (W).

For the sake of simplicity in illustration, only one first anti-warpage pad DPAD1 and only one second anti-warpage pad DPAD2 are illustrated in FIG. 4A. However, it should be understood that a plurality of first anti-warpage pads DPAD1 and a plurality of second anti-warpage pads DPAD2 are provided in embodiments contemplated by the disclosure.

Referring to FIG. 4B, a plurality of first anti-warpage pads DPAD1 may be laid out in each of first unit areas UA1 and second unit areas UA2 of the first wafer W1.

Each of the first anti-warpage pads DPAD1 may have a stripe or line shape extending in a specific direction. An extending direction of the first anti-warpage pads DPAD1 laid out in the first unit areas UA1 and an extending direction of the first anti-warpage pads DPAD1 laid out in the second unit areas UA2 may be different from each other. For example, first anti-warpage pads DPAD1 extending in the first direction FD may be laid out in the first unit areas UA1, and first anti-warpage pads DPAD1 extending in the second direction SD may be laid out in the second unit areas UA2. This layout disperses a stress induced in the first direction FD and a stress induced in the second direction SD and suppresses or reduces a stress from being concentrated in any one direction.

In each unit area UA, an extending direction of the first anti-warpage pads DPAD1 may be the same as an extending direction of anti-warpage grooves RG. For example, in the first unit area UA1, an extending direction of the anti-warpage grooves RG and an extending direction of the first anti-warpage pads DPAD1 may be the same, such as the first direction FD. In the second unit area UA2, an extending direction of the anti-warpage grooves RG and an extending direction of the first anti-warpage pads DPAD1 may be the same, such as the second direction SD.

FIGS. 5A, 6A, 7A, and 8A are cross-sectional views illustrating semiconductor devices having a three-dimensional structure in accordance with other embodiments of the disclosure, and FIGS. 5B, 6B, 7B, and 8B are top views illustrating extending directions of anti-warpage grooves and reinforcing supports illustrated in FIGS. 5A to 8A.

Figure 5A:
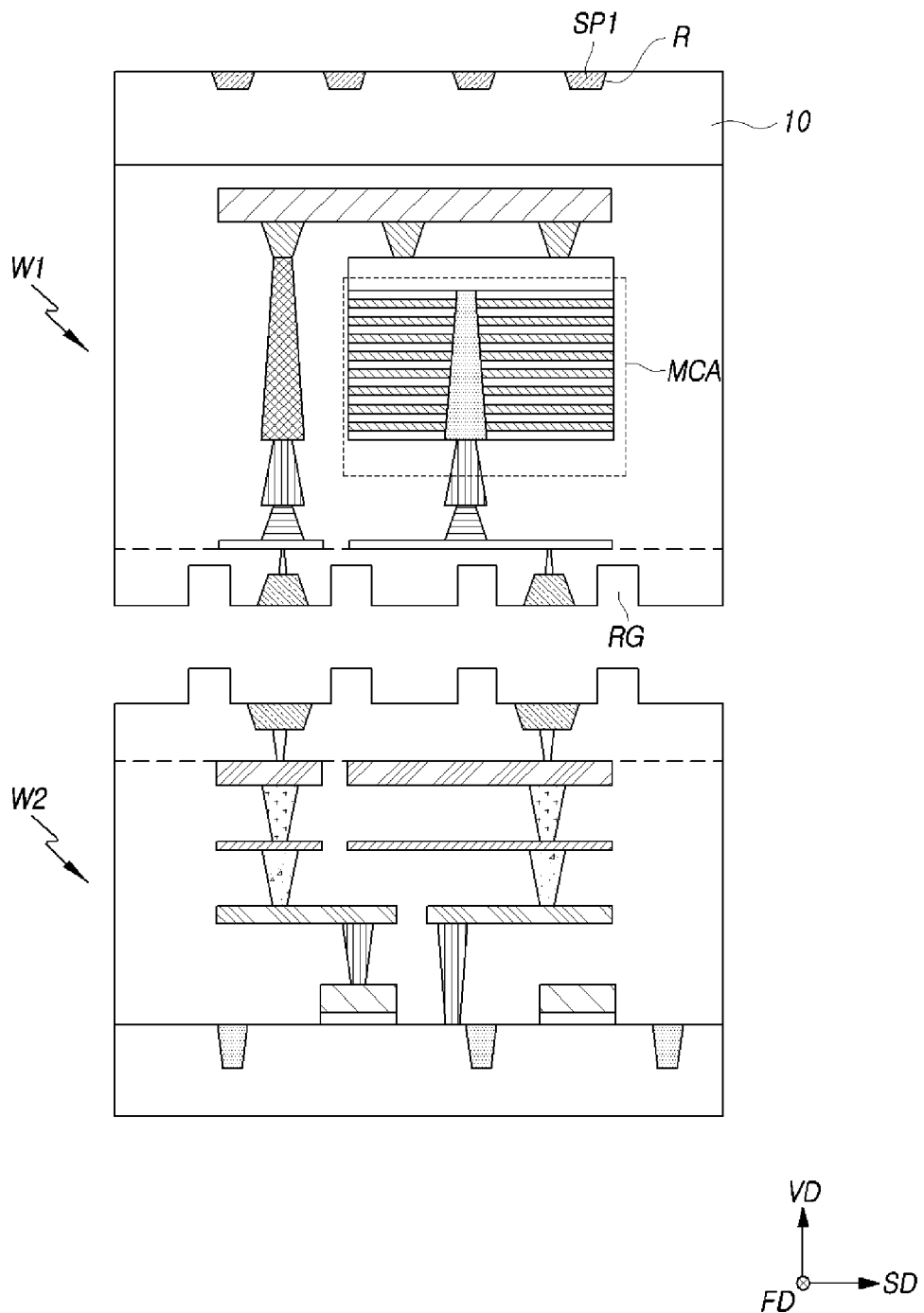
FIGS. 5A, 6A, 7A, and 8A are cross-sectional views illustrating semiconductor devices having a three-dimensional structure in accordance with other embodiments of the disclosure.

Referring to FIG. 5A, a first substrate 10 may have a front surface which is disposed to face a memory cell array MCA and a rear surface that faces away from the front surface. A plurality of grooves R may be formed on the rear surface of the first substrate 10, and reinforcing supports SP1 may fill in the plurality of grooves R. The reinforcing supports SP1 serve to suppress the warpage of a first wafer W1, and may be made of a material that has higher hardness than the first substrate 10.

Figure 5B:
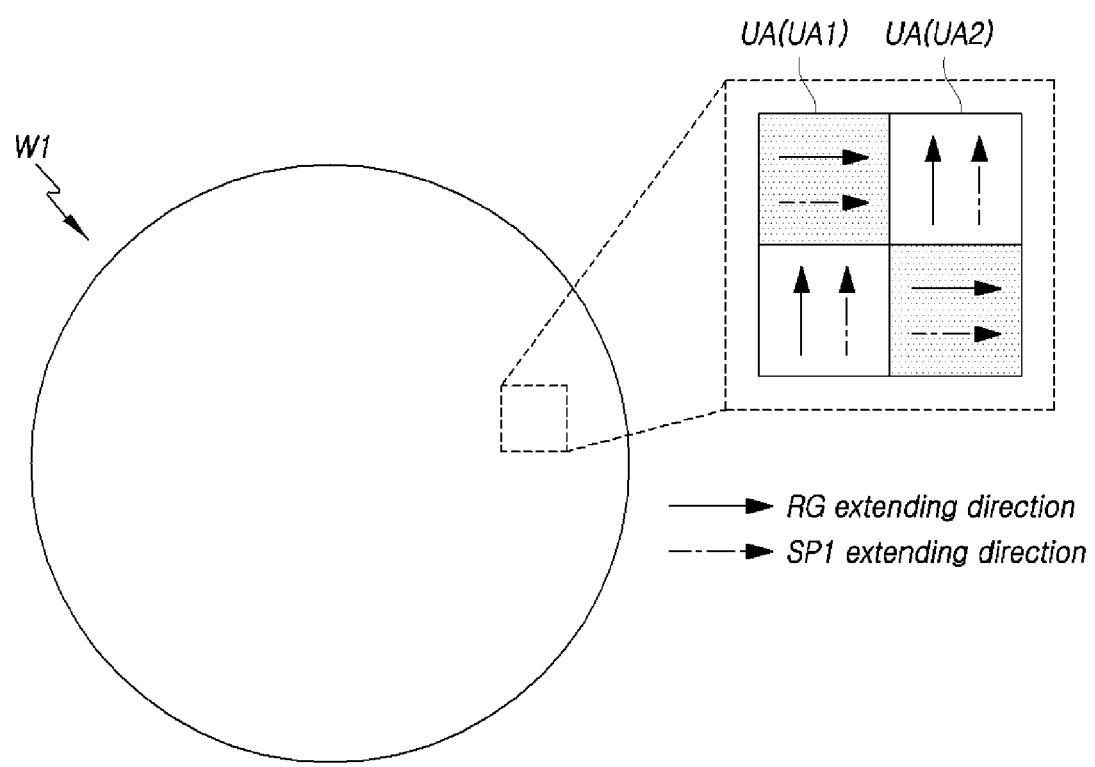
FIGS. 5B, 6B, 7B, and 8B are top views illustrating extending directions of anti-warpage grooves and reinforcing supports illustrated in FIGS. 5A, 6A, 7A, and 8A.

Referring to FIG. 5B, a plurality of reinforcing supports SP1 may be laid out in each of first unit areas UA1 and second unit areas UA2. Each of the reinforcing supports SP1 may have a stripe or line shape extending in a specific direction.

An extending direction of the reinforcing supports SP1 laid out in the first unit areas UA1 and an extending direction of the reinforcing supports SP1 laid out in the second unit areas UA2 may be different from each other. For example, reinforcing supports SP1 extending in the first direction FD may be laid out in the first unit areas UA1, and reinforcing supports SP1 extending in the second direction SD may be laid out in the second unit areas UA2.

In each unit area UA, an extending direction of the reinforcing supports SP1 may be the same as an extending direction of anti-warpage grooves RG. For example, in the first unit area UA1, an extending direction of the anti-warpage grooves RG and an extending direction of the reinforcing supports SP1 may be the same, such as the first direction FD. In the second unit area UA2, an extending direction of the anti-warpage grooves RG and an extending direction of the reinforcing supports SP1 may be the same, such as the second direction SD.

Figure 6A:
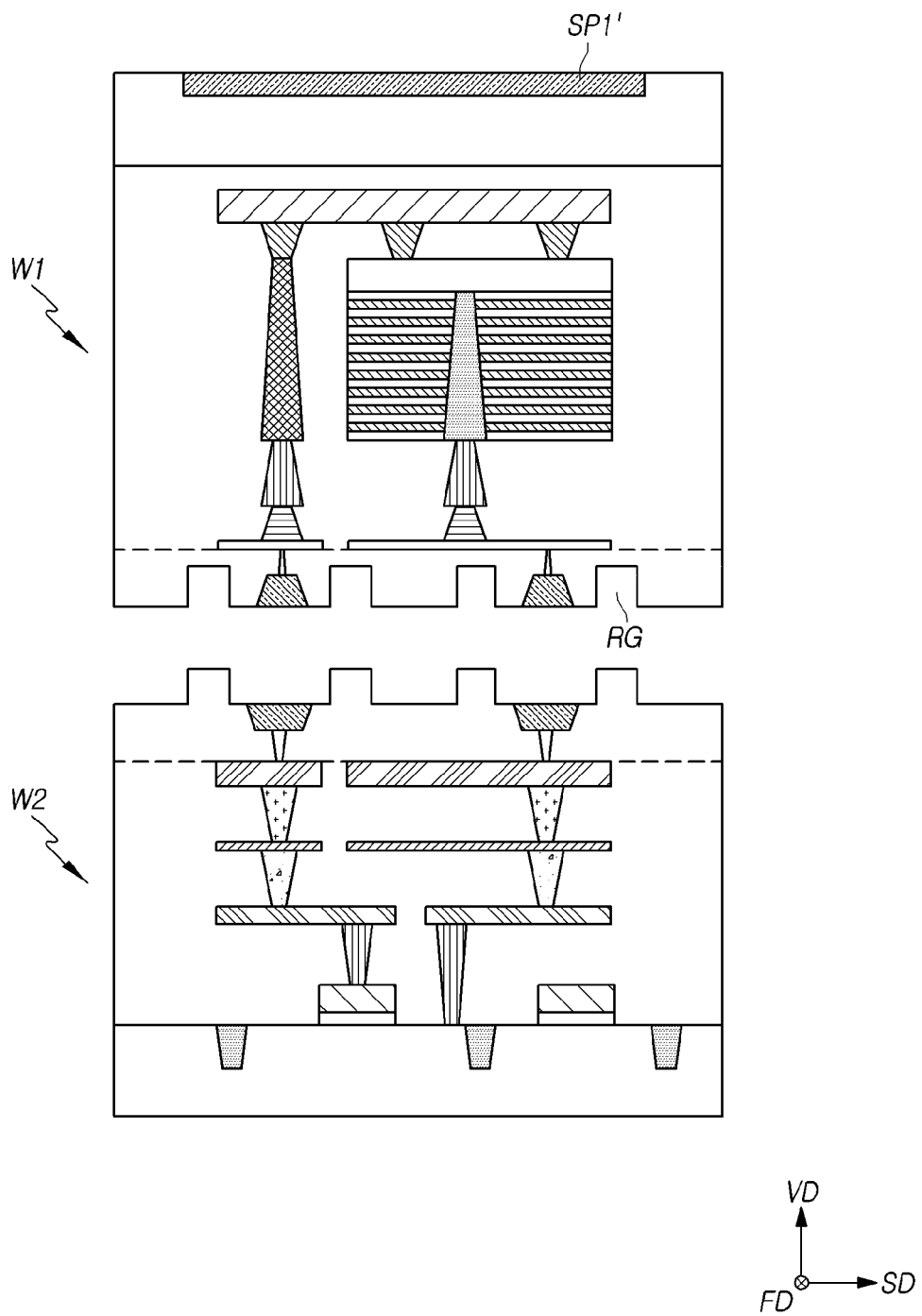
Figure 6B:
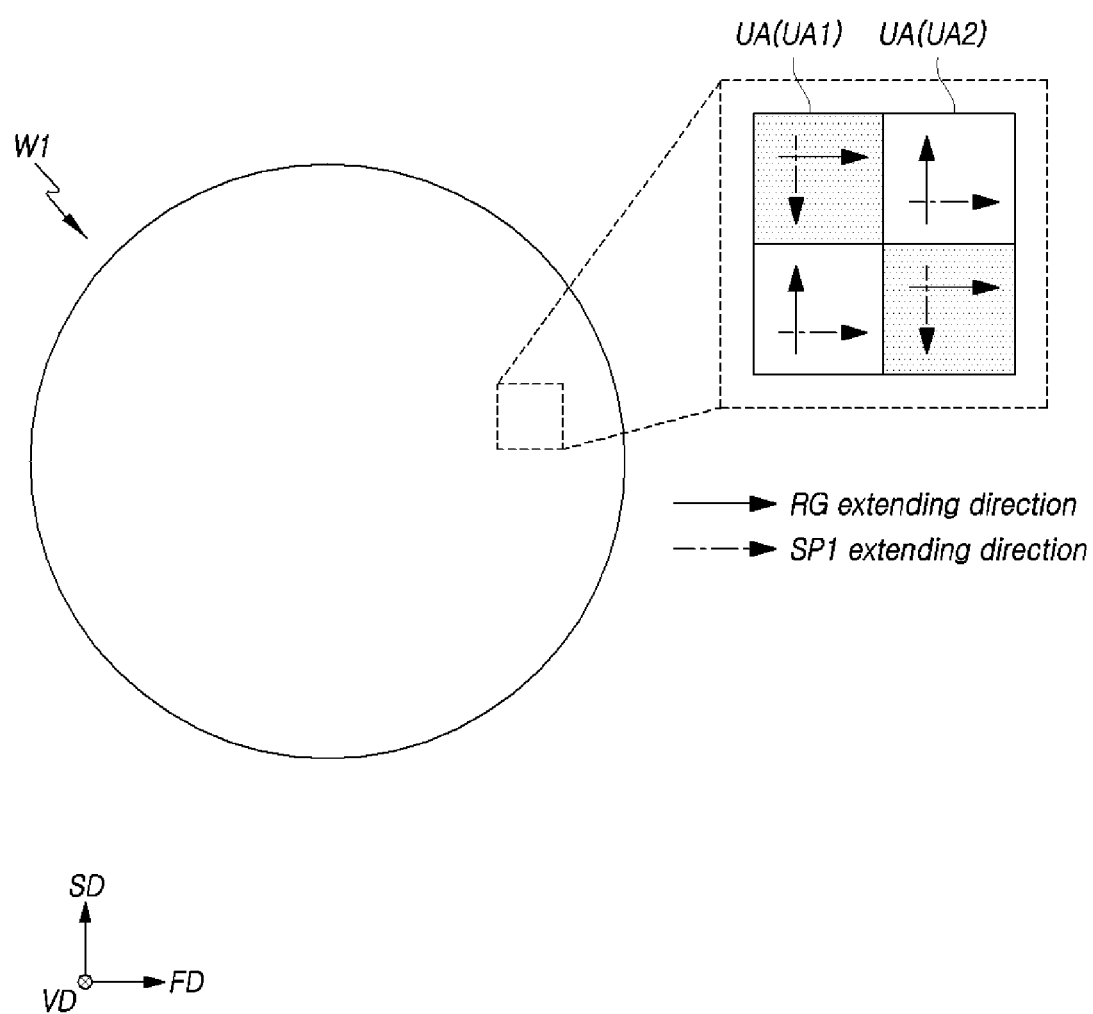

Referring to FIGS. 6A and 6B, in each unit area UA, an extending direction of reinforcing supports SP1' may be different from an extending direction of anti-warpage grooves RG. For example, in a first unit area UA1, an extending direction of the anti-warpage grooves RG may be the first direction FD, and an extending direction of the reinforcing supports SP1' may be the second direction SD. In a second unit area UA2, an extending direction of the anti-warpage grooves RG may be the second direction SD, and an extending direction of the reinforcing supports SP1' may be the first direction FD.

Figure 7A:
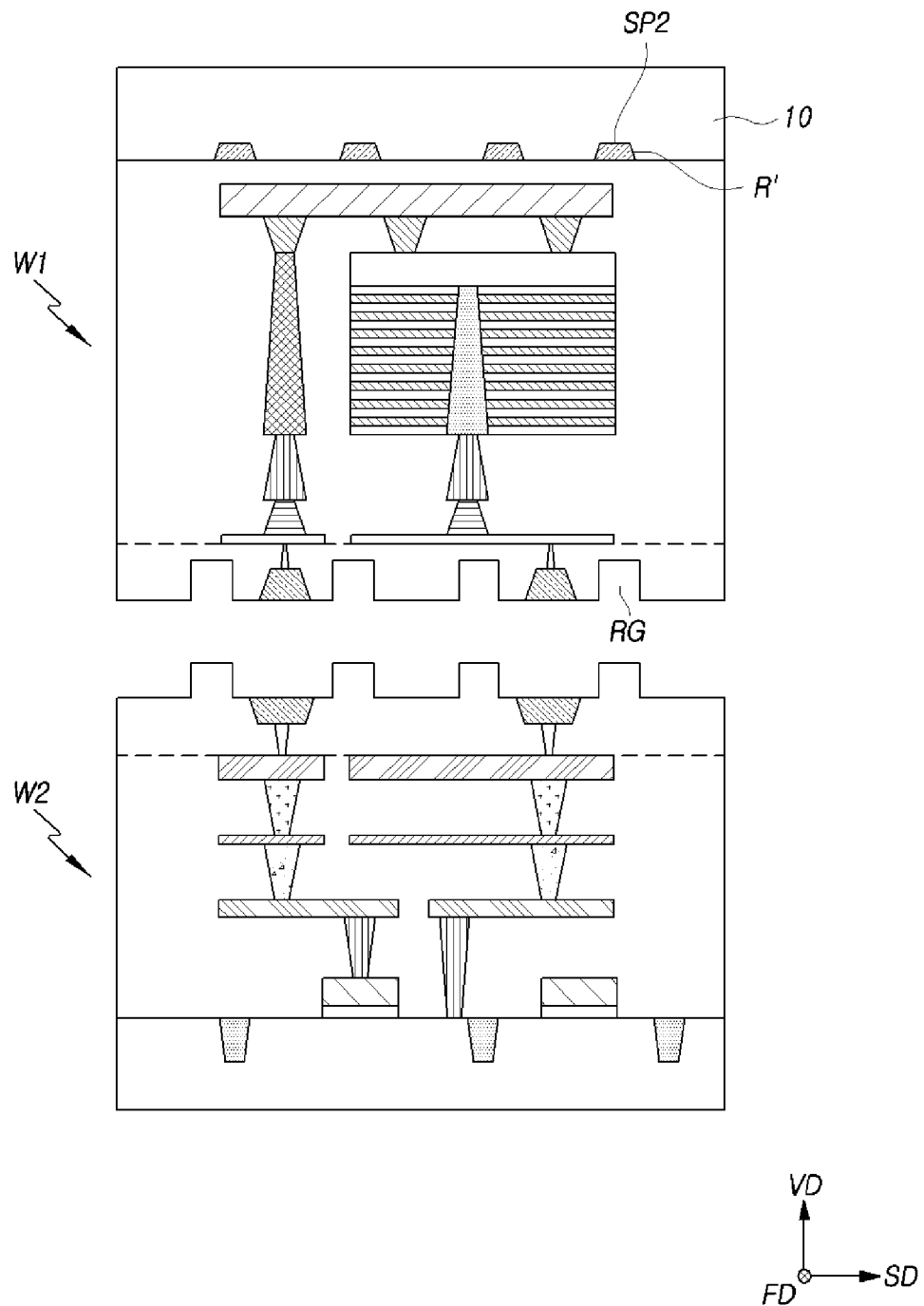

Referring to FIG. 7A, a plurality of grooves R' may be formed on a front surface of a first substrate 10, and reinforcing supports SP2 may fill in the plurality of grooves R'. The reinforcing supports SP2 serve to suppress the warpage of a first wafer W1, and may be made of a material that has higher hardness than the first substrate 10.

Figure 7B:
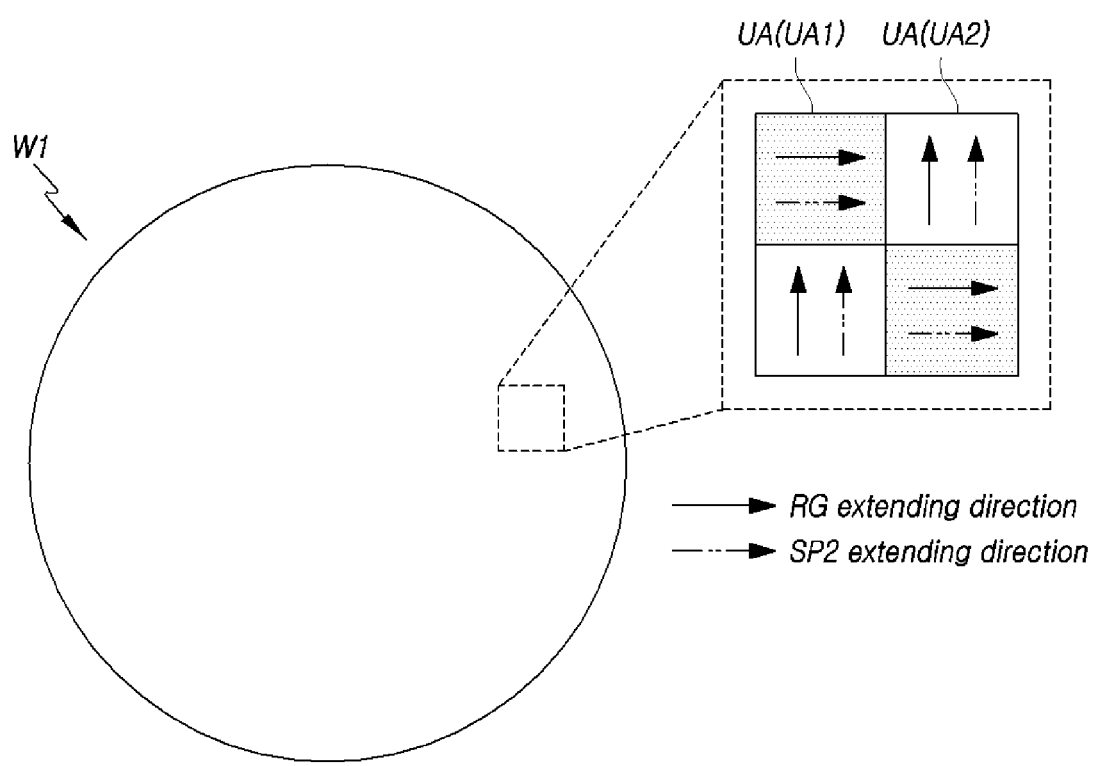

Referring to FIG. 7B, a plurality of reinforcing supports SP2 may be laid out in each of first unit areas UA1 and second unit areas UA2. Similar to the reinforcement support SP1 in FIG. 5A, the reinforcing support SP2 may also have a stripe or line shape extending in a specific direction.

An extending direction of the reinforcing supports SP2 laid out in the first unit areas UA1 and an extending direction of the reinforcing supports SP2 laid out in the second unit areas UA2 may be different from each other. For example, an extending direction of the reinforcing supports SP2 laid out in the first unit areas UA1 may be the first direction FD, and an extending direction of the reinforcing supports SP2 laid out in the second unit areas UA2 may be the second direction SD.

In each unit area UA, an extending direction of the reinforcing supports SP2 may be the same as an extending direction of anti-warpage grooves RG. For example, in the first unit area UA1, an extending direction of the anti-warpage grooves RG and an extending direction of the reinforcing supports SP2 may be the same, such as the first direction FD. In the second unit area UA2, an extending direction of the anti-warpage grooves RG and an extending direction of the reinforcing supports SP2 may be the same, such as the second direction SD.

Figure 8A:
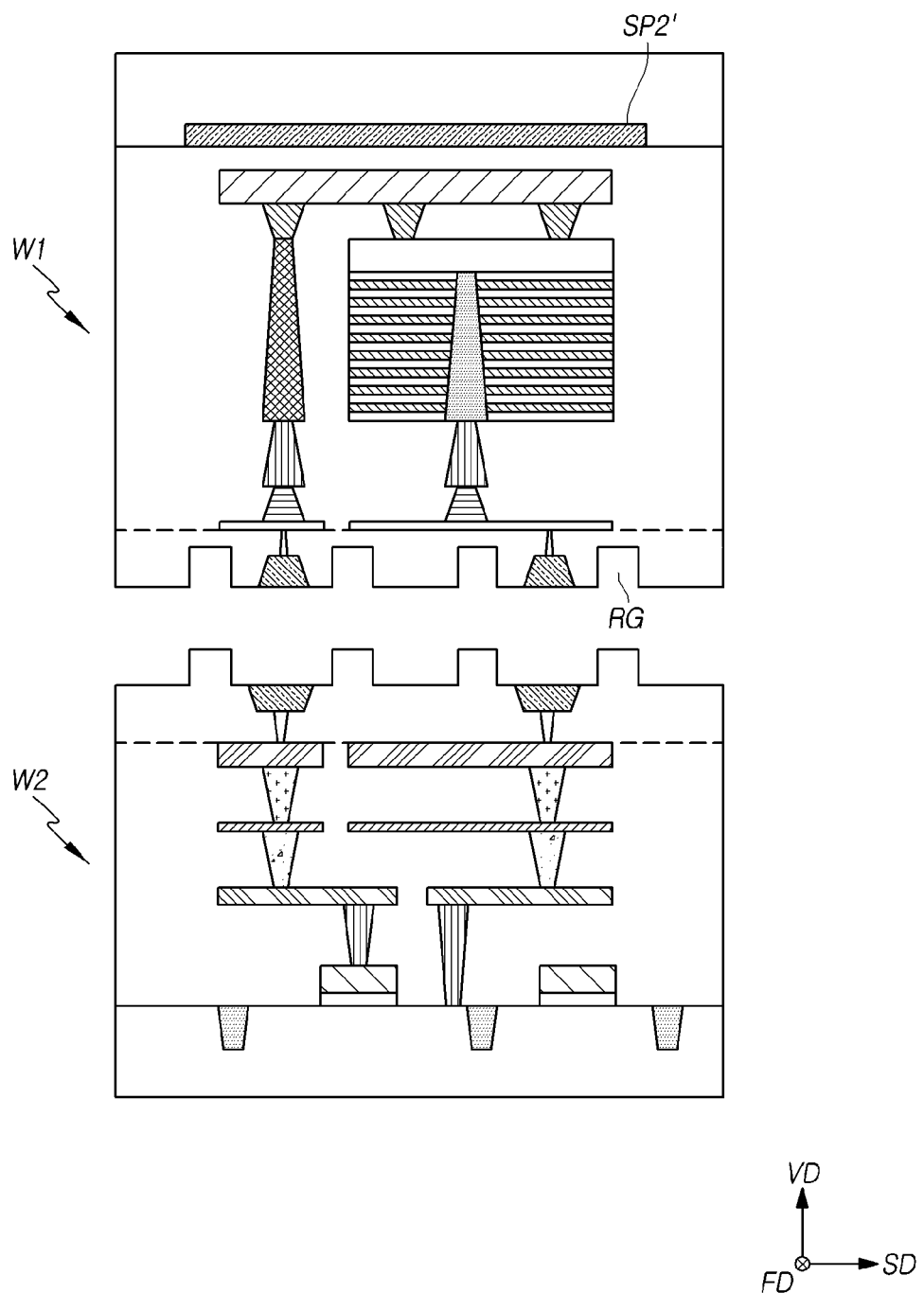
Figure 8B:
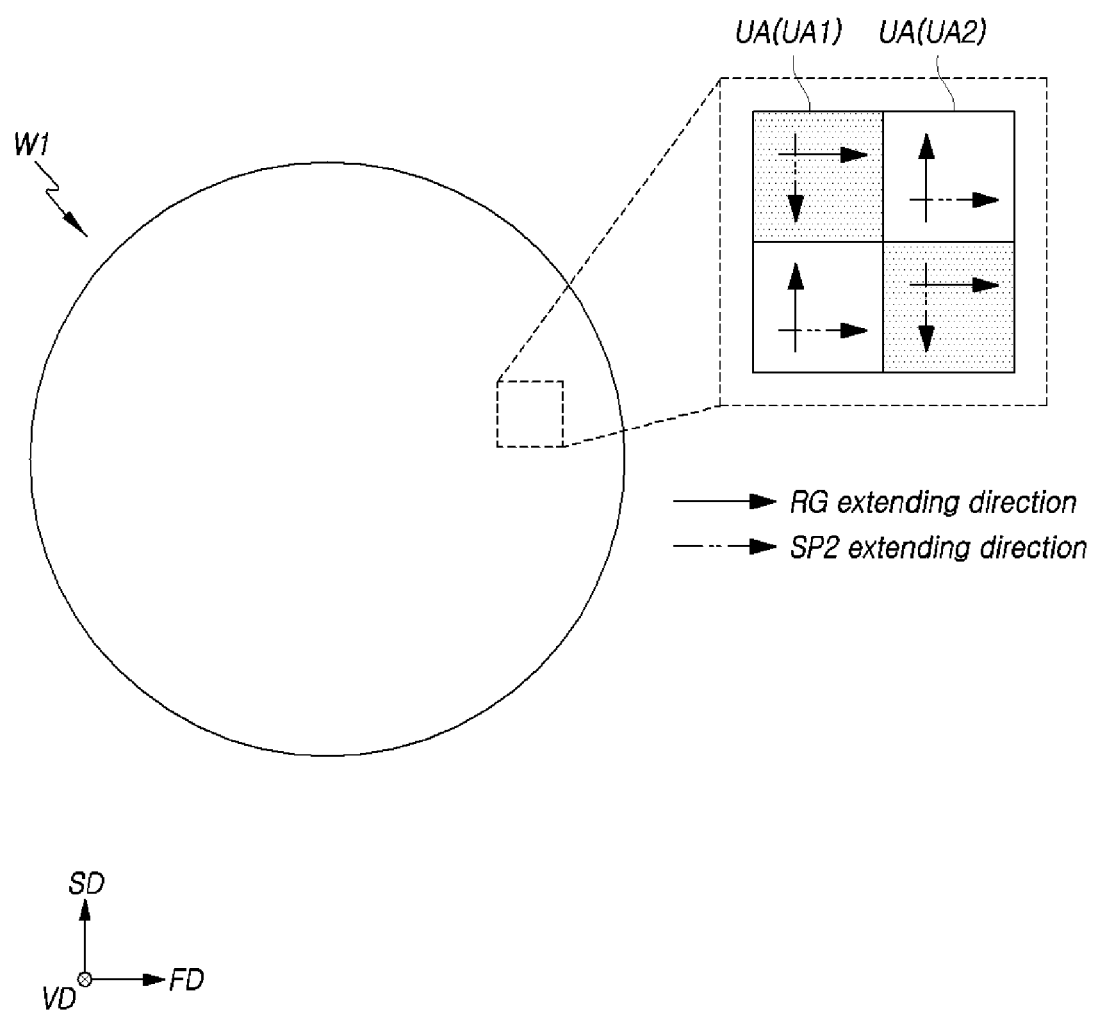

Referring to FIGS. 8A and 8B, in each unit area UA, an extending direction of reinforcing supports SP2' may be different from an extending direction of anti-warpage grooves RG. For example, in a first unit area UA1, an extending direction of the anti-warpage grooves RG may be the first direction FD and an extending direction of the reinforcing supports SP2' may be the second direction SD. In a second unit area UA2, an extending direction of the anti-warpage grooves RG may be the second direction SD and an extending direction of the reinforcing supports SP2' may be the first direction FD.

FIGS. 9 to 13 are cross-sectional views illustrating semiconductor devices having a three-dimensional structure in accordance with still other embodiments of the disclosure.

Figure 9:
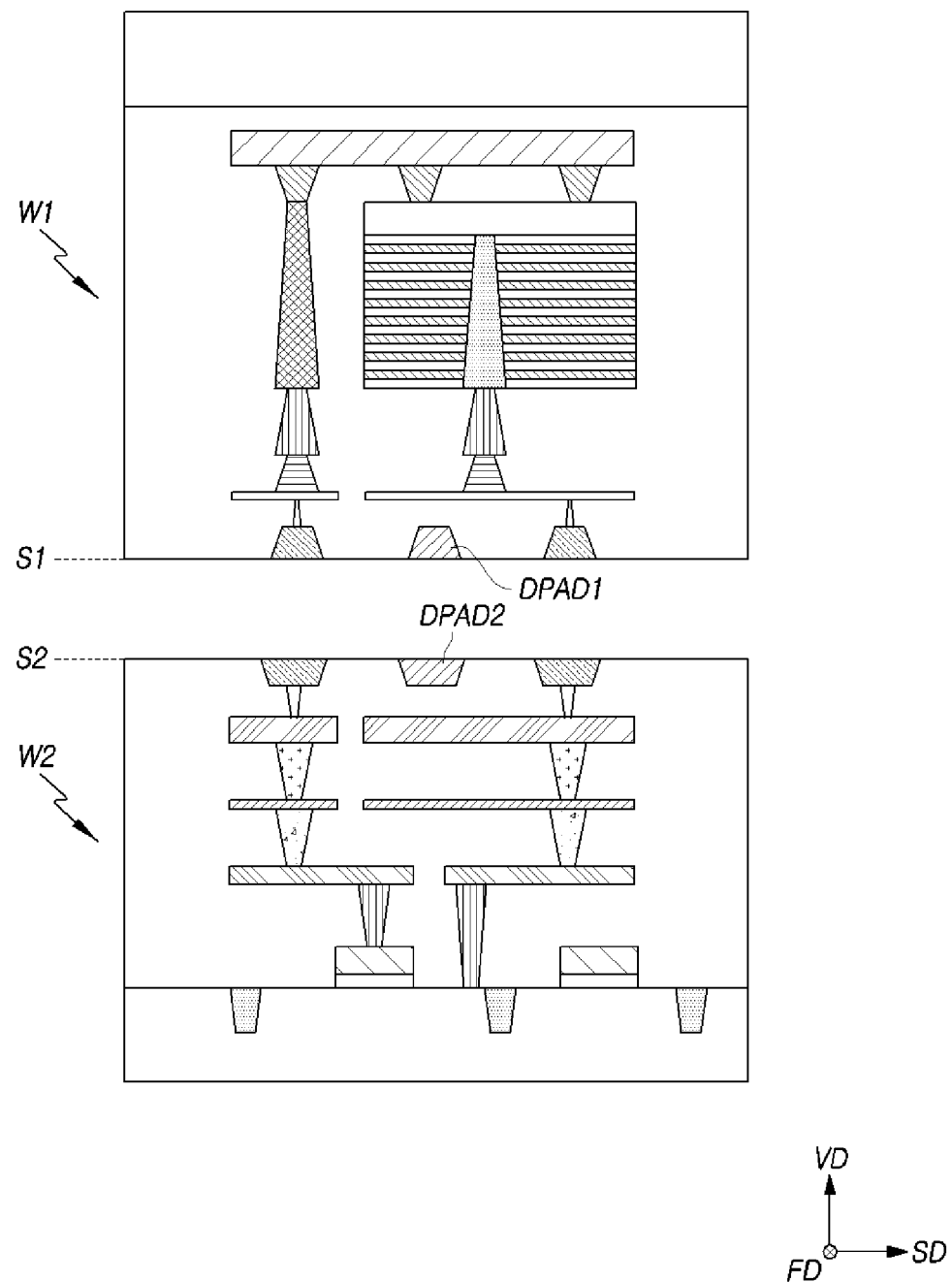
FIGS. 9 to 13 are cross-sectional views illustrating semiconductor devices having a three-dimensional structure in accordance with still other embodiments of the disclosure.

Referring to FIG. 9, a first anti-warpage pad DPAD1 may be defined on one surface S1 of a first wafer W1, and a second anti-warpage pad DPAD2 may be defined on one surface S2 of a second wafer W2. When compared to the embodiment described above with reference to FIGS. 4A and 4B, the embodiment illustrated in FIG. 9 has a structure in which anti-warpage grooves (RG of FIG. 4A) and anti-warpage ribs (RR of FIG. 4A) are omitted.

Figure 10:
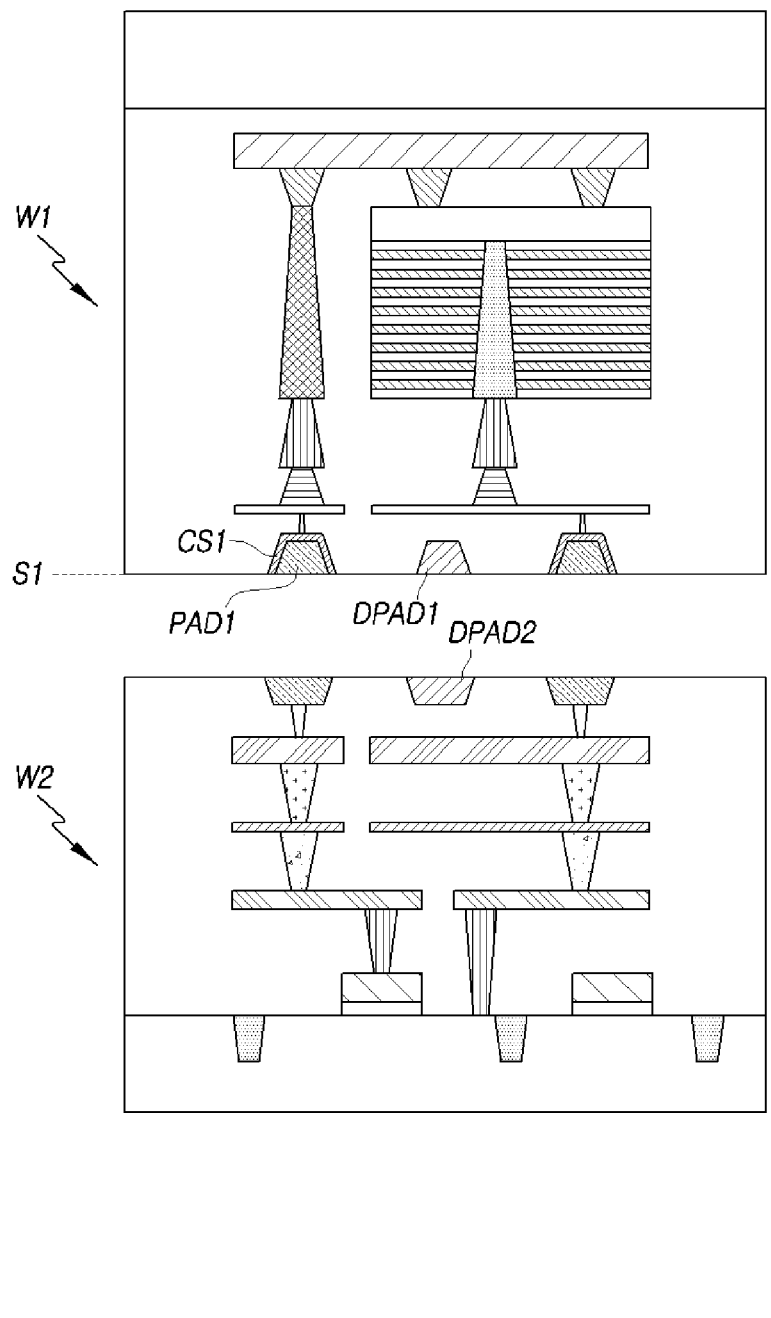

Referring to FIG. 10, a first wafer W1 may further include a conductive reinforcing pattern CS1, which surrounds a side surface and a bottom surface of a first bonding pad PAD1. The conductive reinforcing pattern CS1 may be made of a conductive material that has superior hardness to the first bonding pad PAD1.

The conductive reinforcing pattern CS1 may be formed at the same process step as a first anti-warpage pad DPAD1. For example, a first trench, and a second trench having an opening width larger than that of the first trench, may be formed on one surface S1 of the first wafer W1, and a conductive material may be formed in the first and second trenches. Due to a difference in opening width between the first trench and the second trench, while the first trench with a smaller opening width is completely filled with the conductive material, the conductive material may be linearly formed, or formed in a layer, only on a sidewall and on a bottom surface of the second trench, which has a larger opening width. The conductive material filled in the first trench may configure the first anti-warpage pad DPAD1, and the conductive material layer that is formed on the sidewall and the bottom surface of the second trench may configure the conductive reinforcing pattern CS1. After the conductive reinforcing pattern CS1 is formed, the first bonding pad PAD1 is formed in the second trench.

Figure 11:
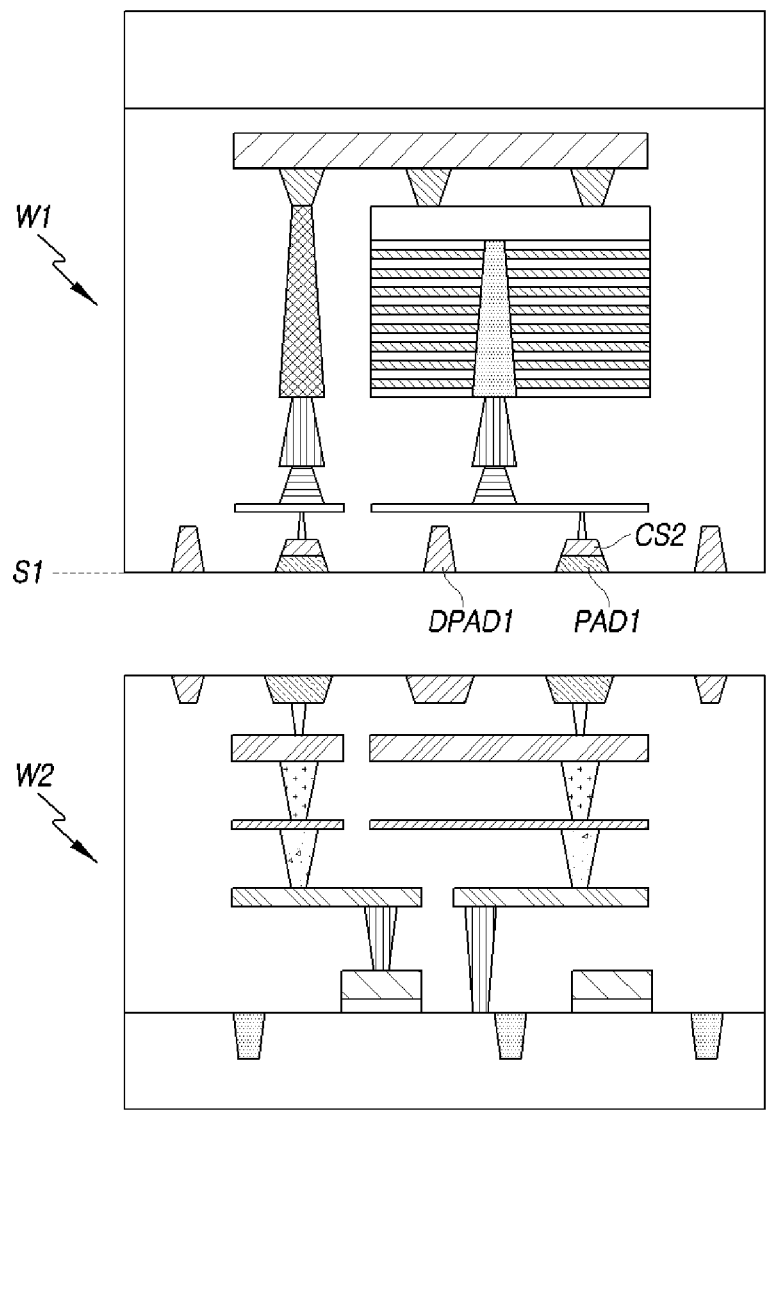

Referring to FIG. 11, a first wafer W1 may further include a conductive reinforcing pattern CS2, which covers a bottom surface of a first bonding pad PAD1. The conductive reinforcing pattern CS2 may be made of a conductive material that has superior hardness to the first bonding pad PAD1.

The conductive reinforcing pattern CS2 may be formed at the same process step as first anti-warpage pads DPAD1. For example, as described above with reference to FIG. 10, after the conductive reinforcing pattern CS1 is formed in the second trench, the conductive reinforcing pattern CS2 may be formed by removing the conductive reinforcing pattern CS1 formed on the sidewall of the second trench. As a result, the conductive reinforcing pattern CS2 is a portion of the conductive reinforcing pattern CS1 that remains on the bottom of the second trench.

Figure 12:
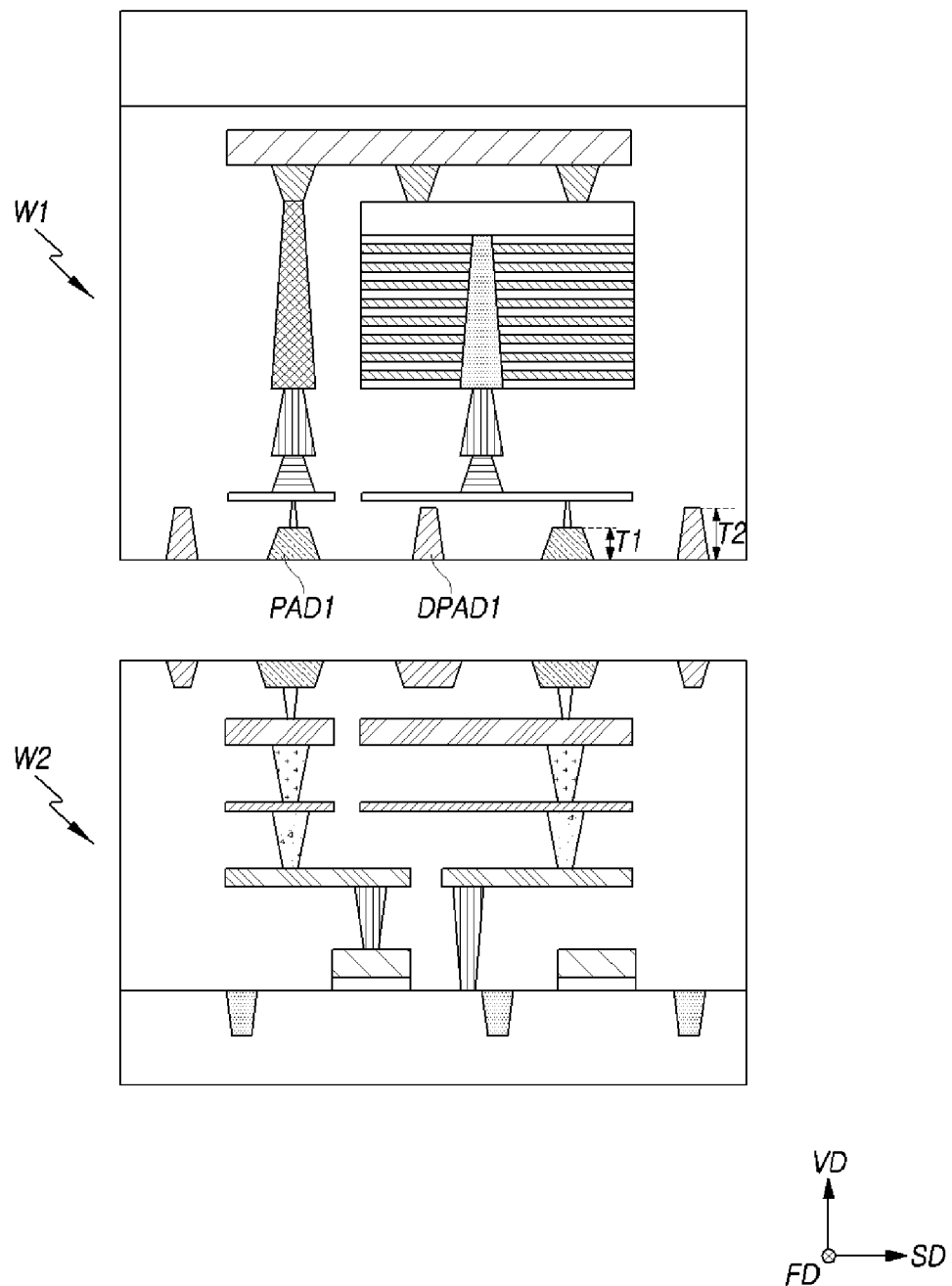

Referring to FIG. 12, in order to increase a warpage suppression effect by first anti-warpage pads DPAD1 in the first wafer W1, the first anti-warpage pads DPAD1 may be formed to a thickness larger than that of first bonding pads PAD1. For example, if a thickness of the first bonding pads PAD1 is T1, then a thickness of the first anti-warpage pads DPAD1 may be T2, which is larger than T1.

Figure 13:
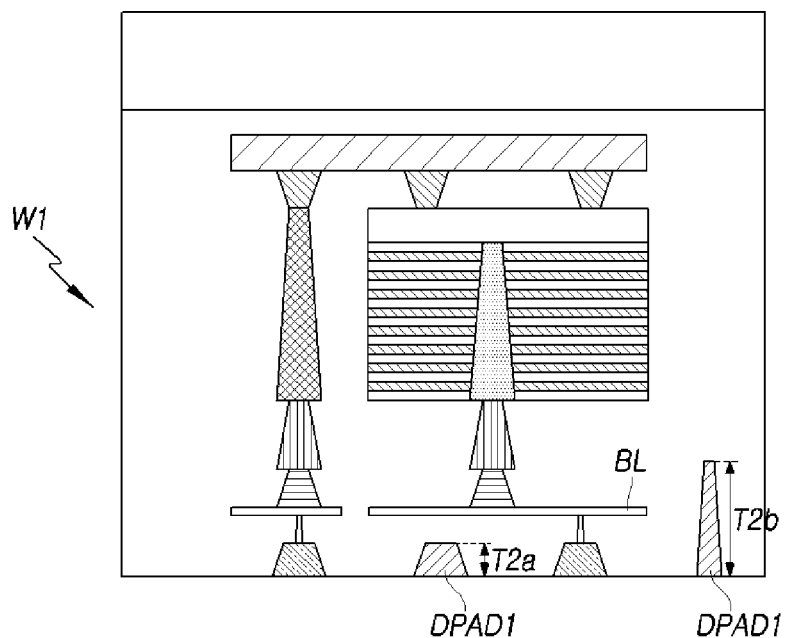
Figure 13:
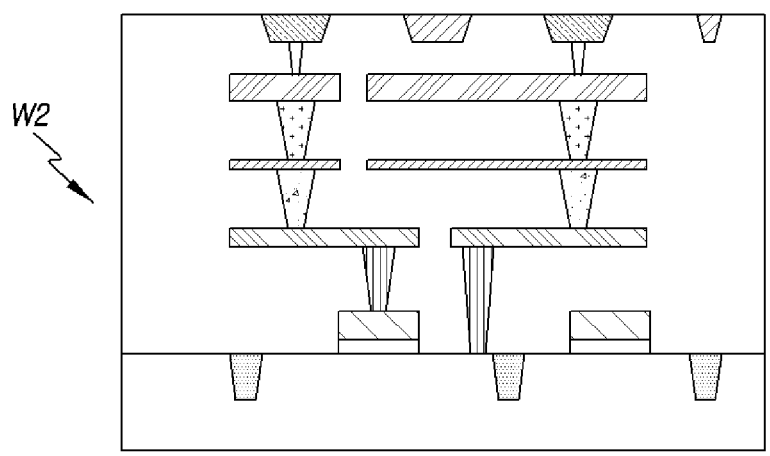
Figure 13:
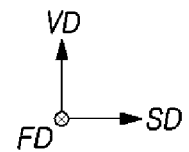

Meanwhile, as illustrated in FIG. 13, first anti-warpage pads DPAD1 may have different thicknesses depending on a position. For example, a first anti-warpage pad DPAD1 that overlaps with a bit line BL in the vertical direction VD may have a thickness of T2a, and a first anti-warpage pad DPAD1 that does not overlap with the bit line BL in the vertical direction VD may have a thickness of T2b, which is larger than T2a.

Figure 14:
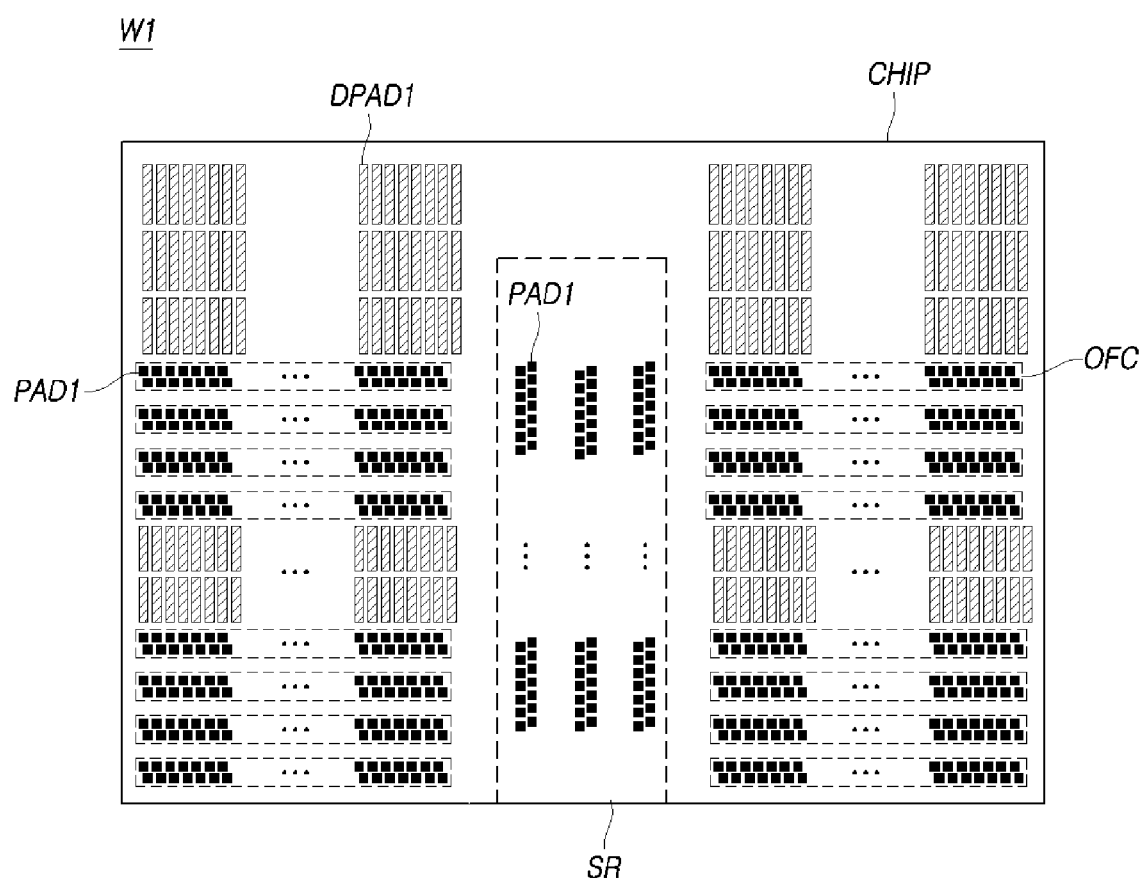
FIG. 14 is a top view illustrating, on a chip level structure, a disposition of first anti-warpage pads in accordance with an embodiment of the disclosure.

FIG. 14 is a top view illustrating, on a chip level structure, a disposition of first anti-warpage pads in accordance with an embodiment of the disclosure.

Referring to FIG. 14, a chip area CHIP of a first wafer W1 may include first coupling areas OFC and a second coupling area SR. First bonding pads PAD1, which are coupled to bit lines, may be laid out in the first coupling areas OFC, and first bonding pads PAD1, which are coupled to word lines, may be laid out in the second coupling area SR.

An area outside the first coupling areas OFC and the second coupling area SR may be defined as an open area. First anti-warpage pads DPAD1 may be disposed in the open area. A length of the first anti-warpage pads DPAD1 may be determined in consideration of a pad alignment margin during wafer bonding.

Figure 15A:
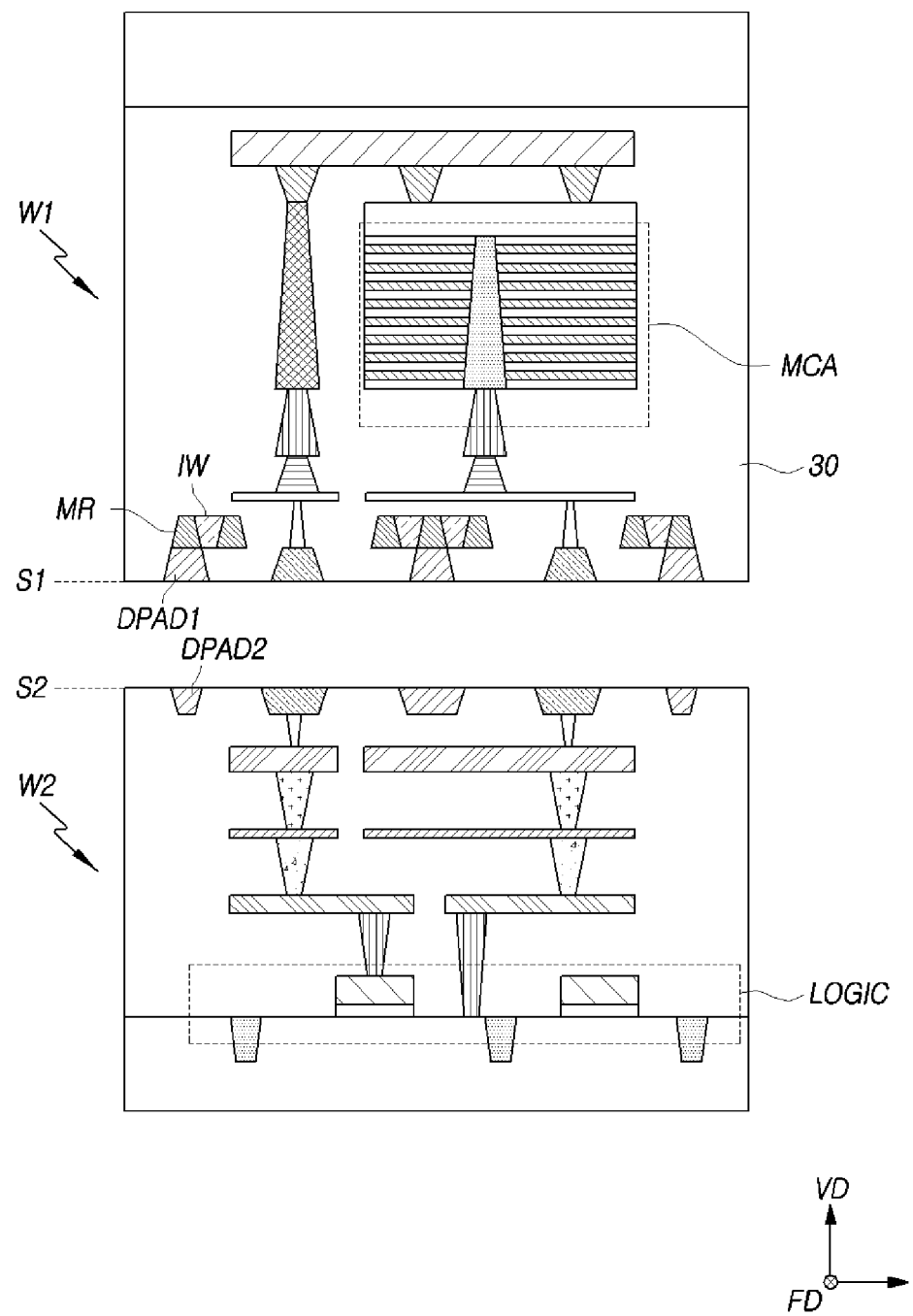
FIG. 15A is a cross-sectional view illustrating a semiconductor device having a three-dimensional structure in accordance with yet another embodiment of the disclosure.
Figure 15B:
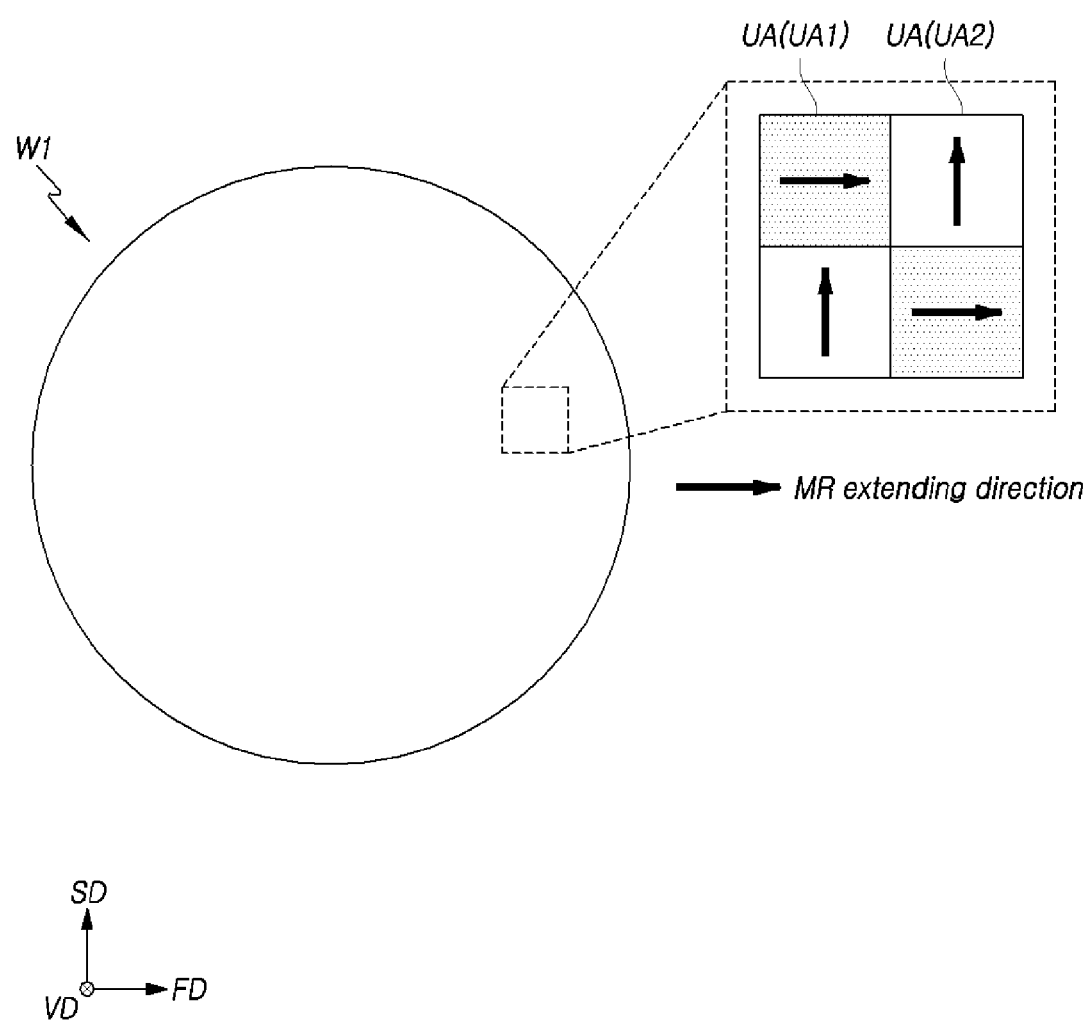
FIG. 15B is a view illustrating extending directions of anti-warpage metal ribs illustrated in FIG. 15A.

FIG. 15A is a cross-sectional view illustrating a semiconductor device having a three-dimensional structure in accordance with yet another embodiment of the disclosure, and FIG. 15B is a top view illustrating extending directions of anti-warpage metal ribs illustrated in FIG. 15A.

Referring to FIG. 15A, a first wafer W1 may include a plurality of anti-warpage metal ribs MR. The anti-warpage metal ribs MR serve to prevent the warpage of the first wafer W1, and may be disposed in a dielectric layer 30 and may be electrically isolated from a memory cell array MCA.

Referring to FIG. 15B, a plurality of anti-warpage metal ribs MR may be laid out in each of first unit areas UA1 and second unit areas UA2. Each of the anti-warpage metal ribs MR may have a stripe or line shape extending in a specific direction. An extending direction of the anti-warpage metal ribs MR laid out in the first unit areas UA1 and an extending direction of the anti-warpage metal ribs MR laid out in the second unit areas UA2 may be different from each other. For example, an extending direction of the anti-warpage metal ribs MR laid out in the first unit areas UA1 may be the first direction FD, and an extending direction of the anti-warpage metal ribs MR laid out in the second unit areas UA2 may be the second direction SD.

Referring back to FIG. 15A, the anti-warpage metal ribs MR may be electrically coupled to each other through coupling wiring lines IW.

The anti-warpage metal ribs MR may be electrically coupled to a first anti-warpage pad DPAD1, which is defined on one surface S1 of the first wafer W1.

A second wafer W2 may include, on one surface S2 thereof, a second anti-warpage pad DPAD2, which is bonded to the first anti-warpage pad DPAD1. Although not illustrated, the second anti-warpage pad DPAD2 may be electrically coupled to a logic circuit LOGIC, and may be provided with a shield voltage from the logic circuit LOGIC. The shield voltage provided to the second anti-warpage pad DPAD2 may be transferred to the anti-warpage metal ribs MR and the coupling wiring lines IW through the first anti-warpage pad DPAD1. The anti-warpage metal ribs MR and the coupling wiring lines IW may serve to suppress interference between the memory cell array MCA of the first wafer W1 and the logic circuit LOGIC of the second wafer W2.

Figure 16:
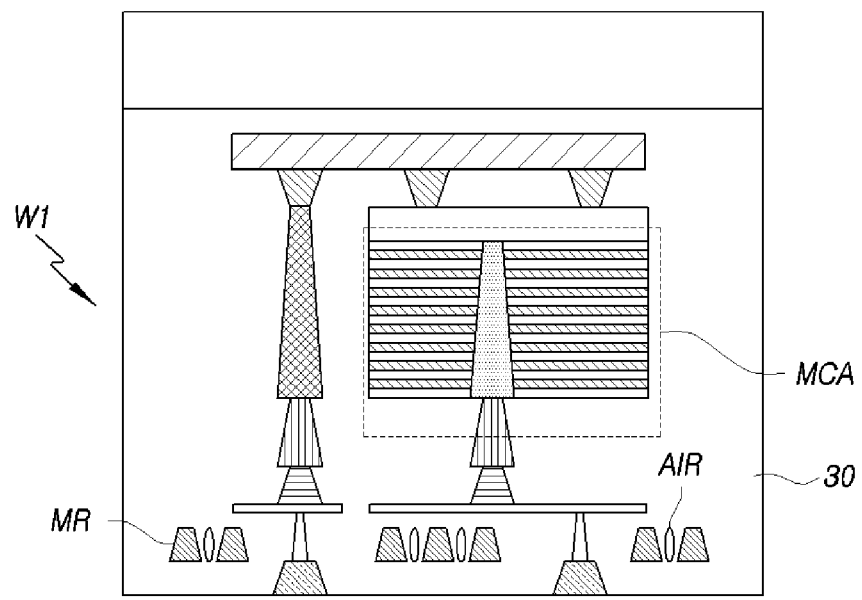
FIG. 16 is a cross-sectional view illustrating a semiconductor device having a three-dimensional structure in accordance with a further embodiment of the disclosure.
Figure 16:
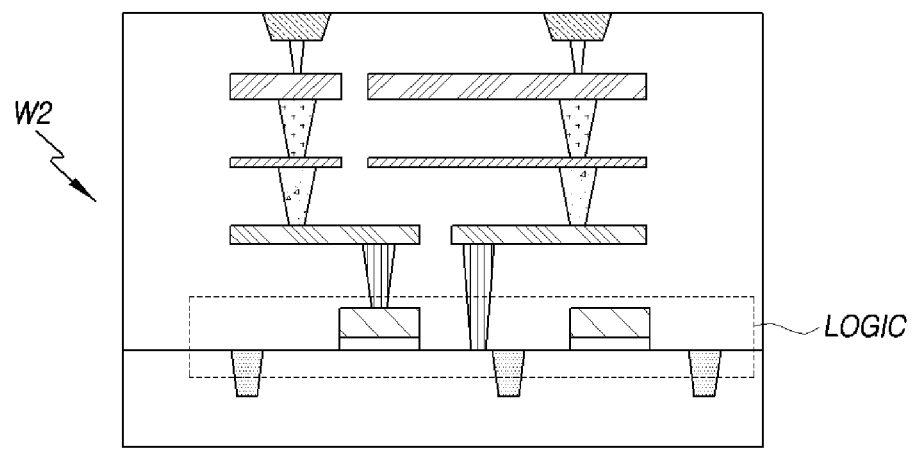
Figure 16:
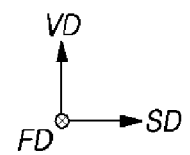

FIG. 16 is a cross-sectional view illustrating a semiconductor device having a three-dimensional structure in accordance with a further embodiment of the disclosure.

Referring to FIG. 16, an air gap AIR may be defined between adjacent anti-warpage metal ribs MR in a dielectric layer 30. The air gap AIR may have a stripe or line shape extending in the same direction as an extending direction of the anti-warpage metal ribs MR. The air gap AIR may serve to disperse or mitigate a stress and thereby suppress the warpage of a first wafer W1.

A dielectric constant of the air gap AIR is $\varepsilon 0$ ($=1$), which is smaller than a dielectric constant ($\varepsilon > 1$) of the dielectric layer 30. Accordingly, when compared to a case in which there is no air gap AIR, where the air gap AIR is formed in the dielectric layer 30, the value of the coupling capacitance between a memory cell array MCA and a logic circuit LOGIC decreases, and thus, the interference between the memory cell array MCA and the logic circuit LOGIC due to the coupling capacitance is reduced.

The above-described exemplary embodiments of the disclosure may be implemented not only through an apparatus and methods but also through a program that realizes a function corresponding to a configuration of the exemplary embodiments of the disclosure or through a recording medium on which the program is recorded, and can be easily implemented by a person of ordinary skill in the art from the description of the foregoing exemplary embodiments.

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted in connection with the appended claims and encompass all equivalents falling within the scope of the appended claims.

What is claimed is:

1. A semiconductor device having a three-dimensional structure, comprising:
   a first wafer including a first bonding pad on one surface thereof;
   a second wafer including a second bonding pad, which is bonded to the first bonding pad, on one surface thereof bonded to the one surface of the first wafer;
   a plurality of anti-warpage grooves on the one surface of the first wafer, and laid out in a stripe shape; and
   a plurality of anti-warpage ribs on the one surface of the second wafer and coupled respectively to the plurality of anti-warpage grooves, and laid out in a stripe shape.

2. The semiconductor device according to claim 1, wherein
   the first wafer includes a plurality of first unit areas and a plurality of second unit areas, which are alternately disposed in a first direction and a second direction,
   the first direction and the second direction are parallel to the one surface of the first wafer and intersect with each other, and
   an extending direction of the anti-warpage grooves disposed in the plurality of first unit areas and an extending direction of the anti-warpage grooves disposed in the plurality of second unit areas are different from each other.

3. The semiconductor device according to claim 2, wherein a sum of areas of the plurality of first unit areas and a sum of areas of the plurality of second unit areas are the same.

4. The semiconductor device according to claim 2, wherein each of the plurality of first unit areas and the plurality of second unit areas has a square shape.

5. The semiconductor device according to claim 2, wherein the first wafer comprises:
   a first substrate;
   a memory cell array disposed over the first substrate and accessed by bit lines and word lines; and
   a first dielectric layer disposed on the first substrate to cover the memory cell array and having the plurality of anti-warpage grooves on a surface part thereof,
   wherein the surface part of the first dielectric layer is made of a dielectric material that has a hardness greater than that of an inner part of the first dielectric layer.

6. The semiconductor device according to claim 5, wherein
   the word lines extend in the first direction, and the bit lines extend in the second direction, and
   an extending direction of the anti-warpage grooves disposed in the plurality of first unit areas is the first direction, and an extending direction of the anti-warpage grooves disposed in the plurality of second unit areas is the second direction.

7. The semiconductor device according to claim 5, wherein the second wafer comprises:
   a second substrate;
   a logic circuit disposed on the second substrate and configured to control the memory cell array; and
   a second dielectric layer defined on the second substrate to cover the logic circuit, and having the plurality of anti-warpage ribs on a surface part thereof,
   wherein the surface part of the second dielectric layer is made of a dielectric material which has a greater hardness than that of an inner part of the second dielectric layer.

8. The semiconductor device according to claim 5, further comprising:
   a plurality of reinforcing supports disposed in a plurality of grooves that are defined on at least one of a front surface of the first substrate facing the memory cell array and on a rear surface of the first substrate facing away from the front surface, and laid out in a stripe shape.

9. The semiconductor device according to claim 8, wherein extending directions of the reinforcing supports disposed in the first unit areas and extending directions of the reinforcing supports disposed in the second unit areas are different from each other.

10. The semiconductor device according to claim 8, wherein the reinforcing supports comprise a material that has a hardness higher than that of the first substrate.

11. A semiconductor device having a three-dimensional structure, comprising:
    a first wafer including a first bonding pad on one surface thereof;
    a second wafer including a second bonding pad, which is bonded to the first bonding pad, on one surface thereof bonded to the one surface of the first wafer;
    a plurality of first anti-warpage pads on the one surface of the first wafer, and laid out in a stripe shape; and
    a plurality of second anti-warpage pads on the one surface of the second wafer and bonded respectively to the plurality of first anti-warpage pads, and laid out in a stripe shape,
    wherein at least one of the plurality of first anti-warpage pads has a thickness greater than that of the first bonding pad.

12. The semiconductor device according to claim 11, wherein
    the first wafer includes a plurality of first unit areas and a plurality of second unit areas, which are alternately disposed in a first direction and a second direction,
    the first direction and the second direction are parallel to the one surface of the first wafer and intersect with each other, and
    an extending direction of the first anti-warpage pads disposed in the plurality of first unit areas and an extending direction of the first anti-warpage pads disposed in the plurality of second unit areas are different from each other.

13. The semiconductor device according to claim 11, further comprising:
    a conductive reinforcing pattern on a side surface and on a bottom surface of the first bonding pad.

14. The semiconductor device according to claim 11, further comprising:
    a conductive reinforcing pattern disposed on a bottom surface of the first bonding pad.

15. The semiconductor device according to claim 11, wherein the plurality of first anti-warpage pads comprise a material with a hardness greater than that of the first bonding pad.

16. A semiconductor device having a three-dimensional structure, comprising:
    a first wafer including a first bonding pad on one surface thereof;
    a second wafer including a second bonding pad, which is bonded to the first bonding pad, on one surface thereof bonded to the one surface of the first wafer; and
    a plurality of anti-warpage metal ribs defined in the first wafer, and laid out in a stripe shape.

17. The semiconductor device according to claim 16, further comprising:
a coupling wiring line coupling the plurality of anti-warpage metal ribs,
wherein a shield voltage is applied to the plurality of anti-warpage metal ribs and the coupling wiring line.

18. The semiconductor device according to claim 16, wherein the first wafer comprises:
a dielectric layer surrounding the plurality of anti-warpage metal ribs; and
an air gap defined between the plurality of anti-warpage metal ribs in the dielectric layer.

19. The semiconductor device according to claim 16, wherein
the first wafer includes a plurality of first unit areas and a plurality of second unit areas, which are alternately disposed in a first direction and a second direction,
the first direction and the second direction are parallel to the one surface of the first wafer and intersect with each other, and
an extending direction of the anti-warpage metal ribs disposed in the plurality of first unit areas and an extending direction of the anti-warpage metal ribs disposed in the plurality of second unit areas are different from each other.

20. A semiconductor device having a three-dimensional structure, comprising:
a first wafer including a first bonding pad on one surface thereof;
a second wafer including a second bonding pad, which is bonded to the first bonding pad, on one surface thereof bonded to the one surface of the first wafer;
a plurality of first anti-warpage pads on the one surface of the first wafer, and laid out in a stripe shape; and
a plurality of second anti-warpage pads on the one surface of the second wafer and bonded respectively to the plurality of first anti-warpage pads, and laid out in a stripe shape,
wherein the plurality of first anti-warpage pads comprise a material with a hardness greater than that of the first bonding pad.

* * * * *